US008975917B2

(12) United States Patent
Yoneda

(10) Patent No.: US 8,975,917 B2
(45) Date of Patent: Mar. 10, 2015

(54) PROGRAMMABLE LOGIC DEVICE

(71) Applicant: Semiconductor Energy Laboratory Co., Ltd., Atsugi-shi, Kanagawa-ken (JP)

(72) Inventor: Seiichi Yoneda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 46 days.

(21) Appl. No.: 13/778,210

(22) Filed: Feb. 27, 2013

(65) Prior Publication Data

US 2013/0229205 A1     Sep. 5, 2013

(30) Foreign Application Priority Data

Mar. 1, 2012    (JP) ................................. 2012-045802

(51) Int. Cl.
    *H03K 19/177*     (2006.01)
    *G11C 11/412*     (2006.01)
    *H03K 19/173*     (2006.01)

(52) U.S. Cl.
    CPC ........ *H03K 19/173* (2013.01); *H03K 19/17784* (2013.01)
    USPC ................ 326/39; 326/38; 365/149; 365/154

(58) Field of Classification Search
    USPC ........ 326/38–41; 708/232, 490; 365/149, 154
    See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,172,521 | B1 | 1/2001 | Motomura |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Vibol Tan
(74) *Attorney, Agent, or Firm* — Fish & Richardson P.C.

(57) ABSTRACT

A programmable logic device includes a plurality of arithmetic circuits; a configuration changing circuit for changing a logic state of each of the plurality of arithmetic circuits by rewriting configuration data; a power supply control circuit for switching between start and stop of supply of power supply voltage to the plurality of arithmetic circuits; a state memory circuit for storing data on configuration, data on a state of power supply voltage, data on use frequency, and data on last use of each of the plurality of arithmetic circuits; and an arithmetic state control circuit for controlling the configuration changing circuit and the power supply control circuit in accordance with the data stored in the state memory circuit. One of the plurality of arithmetic circuits includes a transistor comprising an oxide semiconductor film in a channel formation region.

15 Claims, 16 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,146,546 B2* | 12/2006 | Fukuda | 714/718 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,378,871 B2* | 5/2008 | Okamoto | 326/41 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,428,160 B2 | 9/2008 | Kang | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,750,671 B2 | 7/2010 | Kang | |
| 7,768,313 B2 | 8/2010 | Kang | |
| 8,587,336 B2* | 11/2013 | Sueyoshi et al. | 326/38 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2012/0311365 A1 | 12/2012 | Yoneda et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-285014 A | 10/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-312701 A | 11/2004 |
| JP | 2006-157508 A | 6/2006 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

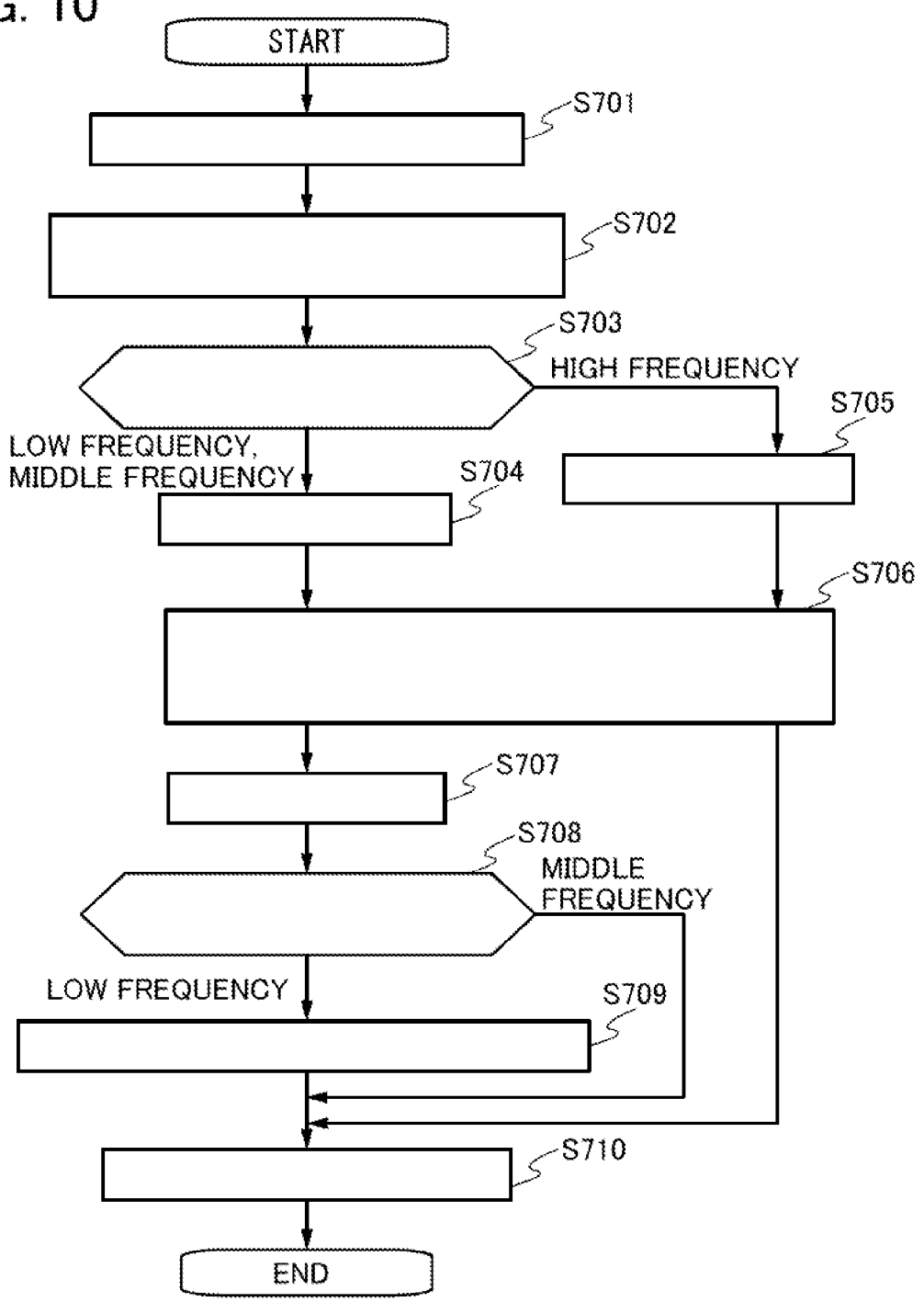

PROGRAMMABLE LOGIC DEVICE

BACKGROUND OF THE INVENTION

1. Field of the Invention

The present invention relates to a programmable logic device.

2. Description of the Related Art

Since a design of a logic circuit in a programmable logic device (PLD) can be changed by a user after the PLD is released on the market, the PLD is used in a variety of products from a prototype to a mass-produced product.

A field programmable gate array (FPGA) is a typical PLD. The FPGA includes a plurality of logic circuits, and an on state and an off state of a switch which changes a connection state of the logic circuits are controlled in accordance with data (configuration data) stored in a memory portion. Thus, a logic state of the FPGA can be changed even after its manufacture.

In recent years, as a programmable logic device in which a connection state of logic circuits can be kept even while power supply voltage is not supplied, a programmable logic device is proposed in which a non-volatile memory such as an electrically erasable programmable read-only memory (EEPROM) or a ferroelectric RAM (FeRAM) is used as a configuration memory (see Patent Document 1).

REFERENCE

Patent Document

[Patent Document 1] Japanese Published Patent Application No. H10-285014

SUMMARY OF THE INVENTION

However, writing voltage of an EEPROM is high. In the case of using an EEPROM as the configuration memory, a boosting circuit is needed for writing of configuration data, which is a disadvantage in higher integration and lower power consumption of the programmable logic device.

Therefore, it is an object of an embodiment of the present invention to achieve improvement of processing speed and reduction in power consumption of a programmable logic device at the time of switching between start and stop of supply of power supply voltage.

An embodiment of the present invention is a programmable logic device including a plurality of arithmetic circuits each of whose logic states can be changed by changing a conduction state of a switch transistor in accordance with configuration data; a configuration changing circuit for changing the logic state by rewriting the configuration data of each of the plurality of arithmetic circuits; a power supply control circuit for switching between start and stop of supply of power supply voltage to the plurality of arithmetic circuits; a state memory circuit for storing data on configuration, data on a state of power supply voltage, data on use frequency, and data on last use of each of the plurality of arithmetic circuits; and an arithmetic state control circuit for controlling the configuration changing circuit and the power supply control circuit in accordance with the data on the configuration, the data on the state of the power supply voltage, the data on the use frequency, and the data on the last use. One of the plurality of arithmetic circuits includes a first switch arithmetic circuit and a memory circuit including a transistor whose channel formation region is formed in an oxide semiconductor film. Another one of the plurality of arithmetic circuits includes a second switch arithmetic circuit and a memory circuit including a transistor whose channel formation region is formed in a semiconductor substrate or a silicon on insulator (SOI) substrate.

An embodiment of the present invention is a programmable logic device including a plurality of arithmetic circuits each of whose logic states can be changed by changing a conduction state of a switch transistor in accordance with configuration data; a configuration changing circuit for changing the logic state by rewriting the configuration data of each of the plurality of arithmetic circuits; a power supply control circuit for switching between start and stop of supply of power supply voltage to the plurality of arithmetic circuits; a state memory circuit for storing data on configuration, data on a use status, data on use frequency, and data on last use of each of the plurality of arithmetic circuits; and an arithmetic state control circuit for controlling the configuration changing circuit and the power supply control circuit in accordance with the data on the configuration, the data on the use status, the data on the use frequency, and the data on the last use. One of the plurality of arithmetic circuits includes a first switch arithmetic circuit and a memory circuit including a transistor whose channel formation region is formed in an oxide semiconductor film. Another one of the plurality of arithmetic circuits includes a second switch arithmetic circuit and a memory circuit including a transistor whose channel formation region is formed in a semiconductor substrate or an SOI substrate.

In an embodiment of the present invention, it is preferable that the arithmetic state control circuit determine the use frequency of the plurality of arithmetic circuits in accordance with the data on the use frequency and select a memory circuit in which the configuration data is stored in accordance with the determination result. Note that in the case where the use frequency of the plurality of arithmetic circuits is high or middle, configuration data is stored in the memory circuit including a transistor whose channel formation region is formed in an oxide semiconductor film. In the case where the use frequency of the plurality of arithmetic circuits is low, configuration data is stored in the memory circuit including a transistor whose channel formation region is formed in a semiconductor substrate or an SOI substrate.

In an embodiment of the present invention, it is preferable that the logic states of the plurality of arithmetic circuits be searched for on the basis of the data on the configuration and that the configuration changing circuit rewrite the configuration data in accordance with the search result.

In an embodiment of the present invention, it is preferable that the configuration changing circuit rewrite the configuration data on the basis of the data on the use frequency and the data on the last use.

In an embodiment of the present invention, it is preferable that the power supply control circuit control supply of power supply voltage to the plurality of arithmetic circuits on the basis of the data on the use frequency.

In an embodiment of the present invention, it is preferable that the data on the last use be updated on the basis of data of a timer circuit included in the arithmetic state control circuit.

In an embodiment of the present invention, it is preferable that a transistor whose channel formation region is formed in an oxide semiconductor film and which is connected to a gate of the switch transistor be provided between each of the plurality of arithmetic circuits and the configuration changing circuit and that the configuration data be stored in the gate of the switch transistor when supply of power supply voltage from the power supply control circuit is stopped.

According to an embodiment of the present invention, improvement of processing speed and reduction in power consumption of a programmable logic device at the time of switching between start and stop of supply of power supply voltage can be achieved.

BRIEF DESCRIPTION OF THE DRAWINGS

In the accompanying drawings:

FIG. 10 is a flow chart showing use frequency and power supply control of an arithmetic circuit of a programmable logic device;

DETAILED DESCRIPTION OF THE INVENTION

Figure 1:
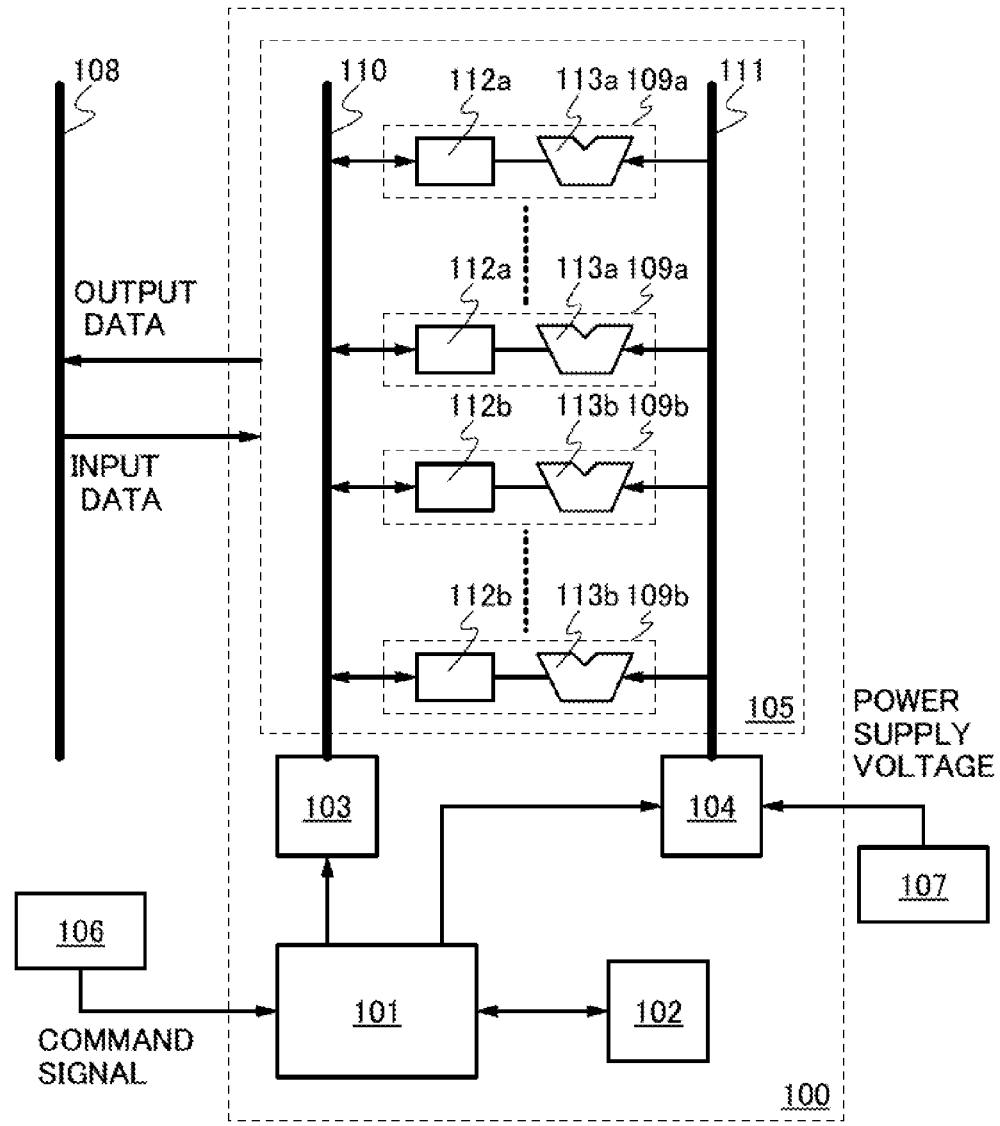
FIG. 1 is a block diagram illustrating a programmable logic device.

Embodiments of the present invention will be hereinafter described with reference to the accompanying drawings. However, the present invention can be carried out in many different modes, and it is easily understood by those skilled in the art that modes and details of the present invention can be modified in various ways without departing from the spirit and scope of the present invention. Therefore, the present invention should not be construed as being limited to the following description of the embodiments. Note that in the structures of the present invention described below, identical portions are denoted by the same reference numerals in different drawings.

Note that the size, the thickness of a layer, signal waveform, and a region in structures illustrated in the drawings and the like in the embodiments are exaggerated for simplicity in some cases. Therefore, embodiments of the present invention are not limited to such scales.

Note that when it is explicitly described that "A and B are connected", the case where A and B are electrically connected, the case where A and B are functionally connected, and the case where A and B are directly connected are included therein.

Note that, in this specification, the terms "first", "second", "third", to "N-th" (N is a natural number) are used only to prevent confusion between components, and thus do not limit the number of components.

Embodiment 1

In this embodiment, a circuit structure of a programmable logic device according to an embodiment of the disclosed invention will be described with reference to FIG. 1, FIG. 2, FIG. 3, FIG. 4, FIG. 5, FIG. 6, and FIG. 7.

FIG. 1 illustrates a structure of a programmable logic device. A programmable logic device 100 includes an arithmetic state control circuit 101, a state memory circuit 102, a configuration changing circuit 103, a power supply control circuit 104, and an arithmetic circuit portion 105. The arithmetic circuit portion 105 includes an arithmetic circuit 109a including a non-volatile memory circuit 112a and a switch arithmetic circuit 113a and an arithmetic circuit 109b including a volatile memory circuit 112b and a switch arithmetic circuit 113b.

The arithmetic state control circuit 101 controls the configuration changing circuit 103 and the power supply control circuit 104 in accordance with an instruction signal (command signal) from a command decoder circuit 106 and data stored in the state memory circuit 102. Note that the command decoder circuit 106 analyzes a signal from the outside of the programmable logic device 100 and sends the instruction signal corresponding to the signal from the outside to the arithmetic state control circuit 101.

The state memory circuit 102 stores data on states of a plurality of arithmetic circuits (also referred to arithmetic and logic units (ALUs) or an ALU circuits) 109a and 109b in the arithmetic circuit portion 105. For example, the state memory circuit 102 stores data on configuration, data on a use status, data on use frequency, and data on last use of each of the plurality of arithmetic circuits 109a and 109b.

Note that data on configuration means data on a logic state of the arithmetic circuit 109a or 109b on the basis of configuration data written to the arithmetic circuit 109a or 109b. Data on use frequency means how frequently an arithmetic circuit is used, and is divided into high use frequency, middle use frequency, and low use frequency. Data on use status means data on use status of the arithmetic circuit 109a or 109b and shows whether an arithmetic circuit is used or not. As for data on last use, time at which the arithmetic circuit 109a or 109b is used for the last time after the logic state of the arithmetic circuit 109a or 109b is changed is stored.

In this specification, the use frequency of an arithmetic circuit is divided into three levels of high use frequency, middle use frequency, and low use frequency in accordance with a period during which the arithmetic circuit is not used (hereinafter such a period is referred to as a use interval T). Each of the levels of the use frequency is described with reference to FIG. 2.

Figure 2:
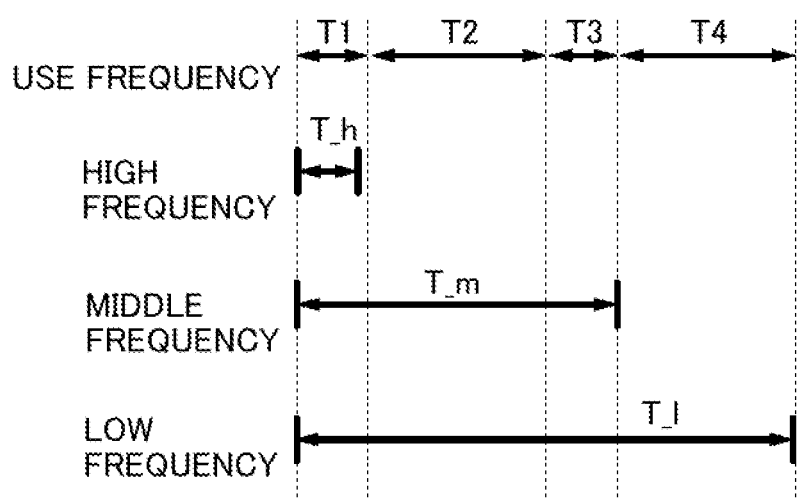
FIG. 2 shows use frequency of an arithmetic circuit.

In an arithmetic circuit with high use frequency, a use interval T_h is shorter than the sum of a process time T1 in which the arithmetic circuit is turned off, the shortest off time T2 in which an effect of power saving is expected, and a process time T3 in which the arithmetic circuit is turned on. In FIG. 2, the use interval T_h is shorter than the process time T1. The arithmetic circuit with high use frequency does not include a writing time T4 in the use interval T_h. Accordingly, the arithmetic circuit includes a non-volatile memory circuit in which writing or overwriting processing is not always required at the time of performing arithmetic processing.

In an arithmetic circuit with middle use frequency, a use interval T_m is longer than or equal to the sum of the process time T1, the off time T2, and the process time T3 and shorter than the sum of the process time T1, the off time T2, the process time T3, and the writing time T4. The arithmetic circuit with middle use frequency does not include the writing time T4 in the use interval T_m. Accordingly, the arithmetic circuit includes a non-volatile memory circuit in which writing or overwriting processing is not always required at the time of performing arithmetic processing. Further, since the off time T2 is in the use interval T_m, power consumption of the arithmetic circuit can be reduced.

In an arithmetic circuit with low use frequency, a use interval T_1 is longer than or equal to the sum of the process time T1, the off time T2, the process time T3, and the writing time T4. The arithmetic circuit with low use frequency includes the writing time T4 in the use interval T_1. Accordingly, writing or overwriting processing can be performed every time arithmetic processing is performed, and the arithmetic circuit includes a volatile memory circuit. Further, since the off time T2 is in the use interval T_1, power consumption of the arithmetic circuit can be reduced.

The configuration changing circuit 103 rewrites configuration data to each of the arithmetic circuits 109a and 109b in accordance with control by the arithmetic state control circuit 101. Specifically, the configuration changing circuit 103 stores some pieces of configuration data in accordance with which the logic states of the arithmetic circuits 109a and 109b can be changed, and outputs necessary configuration data to a given arithmetic circuit in accordance with a control signal from the arithmetic state control circuit 101.

The power supply control circuit 104 controls whether power supply voltage from a power supply circuit 107 is supplied to each of the arithmetic circuits 109a and 109b or the power supply voltage is stopped in accordance with control by the arithmetic state control circuit 101. Note that switching between supply and stop of the power supply voltage is controlled in accordance with data stored in the state memory circuit 102.

Data is input to and output from the arithmetic circuit portion 105 through a data input/output bus 108. The arithmetic circuit portion 105 includes the plurality of arithmetic circuits 109a and 109b. The plurality of arithmetic circuits 109a and 109b is connected to a configuration bus 110 for inputting configuration data from the configuration changing circuit 103 to the plurality of arithmetic circuits 109a and 109b. Further, the plurality of arithmetic circuits 109a and 109b is connected to a power supply voltage bus 111 for inputting power supply voltage from the power supply control circuit 104 to the plurality of arithmetic circuits 109a and 109b.

The arithmetic circuits 109a and 109b include memory circuits 112a and 112b capable of storing configuration data and switch arithmetic circuits 113a and 113b whose logic states can be changed by switch transistors whose conduction states can be changed in accordance with the configuration data stored in the memory circuits 112a and 112b.

The memory circuit 112a included in the arithmetic circuit 109a is a non-volatile memory circuit, and a flash memory, a ferroelectric random access memory (FeRAM), a magnetoresistive random access memory (MRAM), a phase-change memory (PRAM), a resistive random access memory (ReRAM), and the like can be given as typical examples. Further, the memory circuit 112a can be formed using a transistor 121a whose channel formation region is formed in an oxide semiconductor film. Configuration data of an arithmetic circuit with high use frequency or middle use frequency is stored in the non-volatile memory circuit 112a.

Since the memory circuit 112a is a non-volatile memory circuit, configuration data does not need to be saved in another memory circuit when the programmable logic device is turned off. Further, when the programmable logic device is turned on, configuration data does not always need to be written or overwritten each time an arithmetic circuit performs arithmetic processing. Note that although a non-volatile memory circuit has lower rewriting speed and lower overwriting speed than a volatile memory circuit, configuration data is written or overwritten less frequently to the non-volatile memory circuit; therefore, operation speed of a programmable device is less adversely affected.

The memory circuit 112b included in the arithmetic circuit 109b is a volatile memory circuit, and is typically a memory circuit including a transistor whose channel formation region is formed in a semiconductor substrate or an SOI substrate, such as a static random access memory (SRAM) or a dynamic random access memory (DRAM). Configuration data of an arithmetic circuit with low use frequency is stored in the volatile memory circuit 112b.

Even when supply of power is stopped without configuration data saved and the data is lost, the data does not need to be rewritten because the data is of an arithmetic circuit with low use frequency. Further, because of high writing speed, configuration data does not need to be saved in another memory circuit when a programmable device is turned off. In addition, when a programmable device is turned on, configuration data is written or overwritten every time an arithmetic circuit performs arithmetic processing. Note that since the use frequency of the arithmetic circuit is low, operation speed of a programmable device is not adversely affected even when configuration data is written or overwritten every time the arithmetic circuit performs arithmetic processing. Further, since a volatile memory circuit has higher rewriting speed and higher overwriting speed than a non-volatile memory circuit, operation speed of a programmable device is less adversely affected.

Note that the arithmetic circuits 109a and 109b may be arranged in matrix and the configuration bus 110 and the power supply voltage bus 111 may extend in the row direction or in the column direction between the plurality of arithmetic circuits. Note that the arithmetic circuits 109a and 109b are not necessarily arranged in matrix. For example, the arithmetic circuits 109a and 109b may be provided adjacent to each other in the row direction or in the column direction and the configuration bus 110 and the power supply voltage bus 111 may extend in the row direction or in the column direction.

Figure 3:
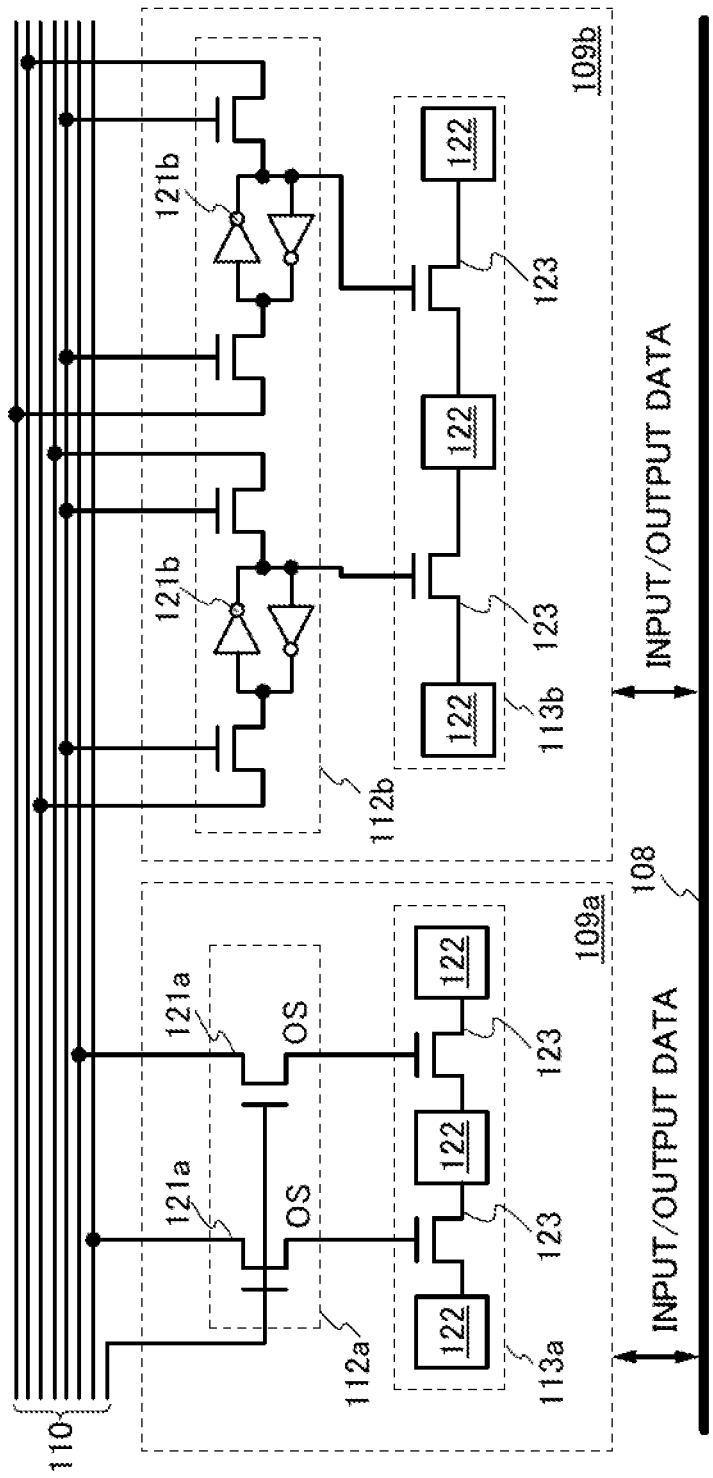
FIG. 3 is a block diagram illustrating a programmable logic device.

FIG. 3 shows detailed structures of the arithmetic circuits 109a and 109b illustrated in FIG. 1. Here, a structure example in which the transistor 121a whose channel formation region is formed in an oxide semiconductor film is used in the memory circuit 112a and an SRAM is used in the memory circuit 112b will be described.

The arithmetic circuit 109a illustrated in FIG. 3 includes the memory circuit 112a and the switch arithmetic circuit 113a. The arithmetic circuit 109b includes the memory circuit 112b and the switch arithmetic circuit 113b. Although an example in which each arithmetic circuit includes one memory circuit and one switch arithmetic circuit is illustrated in FIG. 3, a plurality of memory circuits and a plurality of switch circuits may be included.

The configuration bus 110 includes a plurality of wirings so that the memory circuits 112a and 112b are supplied with different pieces of configuration data. Data is input to the switch arithmetic circuits 113a and 113b through the data input/output bus 108, and data based on logic states of the switch arithmetic circuits 113a and 113b is output through the data input/output bus 108.

The memory circuit 112a includes the transistors 121a each of whose channel formation regions is formed in an oxide semiconductor film. Further, the switch arithmetic circuit 113a includes a plurality of logic circuits 122 and switch transistors 123 provided for the respective transistors 121a.

The memory circuit 112b includes SRAMs 121b. Further, the switch arithmetic circuit 113b includes a plurality of logic circuits 122 and switch transistors 123 provided for the respective SRAMs 121b.

Each of the switch transistors 123 can control a connection state between the logic circuits 122 by control of its conduction state. By control of the connection state, the logic states of the switch arithmetic circuits 113a and 113b can be changed.

Note that each of the transistors 121a included in the memory circuit 112a can hold a gate potential of the corresponding switch transistor 123 because of small off-state current of the transistors 121a. Therefore, with the structure in FIG. 3, the connection state between the logic circuits 122 in the switch arithmetic circuit 113a can be kept even while the power supply voltage is not supplied.

Further, in the structure illustrated in FIG. 3, the gate potential of the switch transistor is held because of small off-state current of the transistor included in the memory circuit, so that configuration data can be held. Accordingly, deterioration of a memory element can be reduced in the structure illustrated in FIG. 3 in which rewriting and holding of configuration data are performed by switching between an on state and an off state of the transistor, compared to a structure in which rewriting and holding of configuration data are performed by repeated structure change.

Note that in this specification, off-state current is current which flows between a source and a drain when a transistor is in an off state. In the case of an n-channel transistor (whose threshold voltage is, for example, about 0 V to 2 V), off-state current refers to current flowing between a source and a drain when negative voltage is applied between a gate and the source.

In this embodiment, with the use of a transistor whose channel formation region is formed in an oxide semiconductor film, off-state current of each of the transistors 121a included in the memory circuit 112a is reduced as much as possible. Note that in drawings such as FIG. 3, "OS" is written in order to indicate that the transistors 121a are each a transistor whose channel formation region is formed in an oxide semiconductor film.

The SRAMs 121b included in the memory circuit 112b can operate at higher speed than the transistors 121a each of whose channel formation regions is formed in an oxide semiconductor film. Therefore, the SRAMs 121b can operate at high speed in an on state and rewriting operation can be performed at high speed.

Here, an oxide semiconductor in which a channel formation region of the transistor 121a is formed will be described. At least indium (In) or zinc (Zn) is preferably contained in an oxide semiconductor used for the channel formation region of the transistor 121a. Alternatively, the oxide semiconductor preferably contains both In and Zn. In order to reduce variation in electrical characteristics of the transistor including the oxide semiconductor, the oxide semiconductor preferably contains one or more of stabilizers in addition to In and/or Zn.

As a stabilizer, gallium (Ga), tin (Sn), hafnium (Hf), aluminum (Al), zirconium (Zr), and the like can be given.

As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, the following can be used: indium oxide, tin oxide, zinc oxide, a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide, a three-component metal oxide such as an In—Ga—Zn-based metal oxide (also referred to as IGZO), an In—Al—Zn-based metal oxide, an In—Sn—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide, or a four-component metal oxide such as an In—Sn—Ga—Zn-based metal oxide, an In—Hf—Ga—Zn-based metal oxide, an In—Al—Ga—Zn-based metal oxide, an In—Sn—Al—Zn-based metal oxide, an In—Sn—Hf—Zn-based metal oxide, or an In—Hf—Al—Zn-based metal oxide.

In the above-listed metal oxides, an In—Ga—Zn-based metal oxide, for example, is an oxide whose main components are In, Ga, and Zn, and there is no particular limitation on the ratio of In:Ga:Zn. The In—Ga—Zn-based metal oxide may contain a metal element other than In, Ga, and Zn.

Alternatively, a material represented by $InMO_3(ZnO)_n$, (m>0, m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, n is an integer) may be used.

For example, an In—Ga—Zn-based metal oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratios can be used. Alternatively, an In—Sn—Zn-based metal oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used in accordance with needed semiconductor characteristics and electric characteristics (e.g., field-effect mobility, the threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, high mobility can be obtained relatively easily in the case where an In—Sn—Zn-based metal oxide is used. However, the mobility can be increased by reducing the defect density in the bulk also in the case where an In—Ga—Zn-based metal oxide is used.

Further, the energy gap of the oxide semiconductor is 2 eV or more, preferably 2.5 eV or more, more preferably 3 eV or more. The off-state current of a transistor can be reduced with the use of an oxide semiconductor having a wide energy gap.

The oxide semiconductor may be either single crystal or non-single-crystal. In the case where the oxide semiconductor is non-single-crystal, the oxide semiconductor is preferably polycrystal or a CAAC-OS (c-axis aligned crystalline oxide semiconductor) with which a field-effect mobility higher than that of an amorphous oxide semiconductor can be expected. Alternatively, in the case where the oxide semiconductor is non-single-crystal, the oxide semiconductor may be amorphous. Further, the oxide semiconductor may have an amorphous structure including a portion having crystallinity. Note that a portion having crystallinity included in an amorphous structure may be microcrystal having a size greater than or equal to 1 nm and less than 10 nm. That is, the oxide semiconductor may be amorphous, and it is preferable that the oxide semiconductor have a non-amorphous structure including a crystalline component in the oxide semiconductor in order to improve the field-effect mobility or reliability of the transistor.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

An oxide semiconductor film preferably includes a plurality of crystal portions. In each of the crystal portions, a c-axis is preferably aligned in a direction parallel to a normal vector of a surface where the oxide semiconductor film is formed or a normal vector of a surface of the oxide semiconductor film. Note that, among crystal portions, the directions of the a-axis and the b-axis of one crystal portion may be different from those of another crystal portion. An example of such an oxide semiconductor film is a CAAC-OS film. In the CAAC-OS, for example, c-axes are aligned, and a-axes and/or b-axes are not macroscopically aligned.

The CAAC-OS film is not absolutely amorphous. The CAAC-OS film includes an oxide semiconductor with a crystal-amorphous mixed phase structure where crystal portions and amorphous portions are intermingled. Note that in most cases, the crystal portion fits inside a cube whose one side is less than 100 nm. In an image obtained with a transmission electron microscope (TEM), a boundary between an amorphous portion and a crystal portion and a boundary between crystal portions in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a term "perpendicular" includes a range from 80° to 100°, preferably from 85° to 95°. In addition, a term "parallel" includes a range from −10° to 10°, preferably from −5° to 5°. Note that part of oxygen included in the oxide semiconductor film may be substituted with nitrogen.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal portions or followed by the formation of the crystal portions through crystallization treatment such as heat treatment.

Hence, the c-axes of the crystal portions are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

In a transistor whose channel formation region is formed in an oxide semiconductor film which is highly purified by drastic removal of hydrogen contained in the oxide semiconductor, the off-state current can be 100 zA/μm or less, preferably 10 zA/μm or less, more preferably 1 zA/μm or less. Thus, the off-state current of the transistor is extremely smaller than that of a transistor including silicon with crystallinity. As a result, even when the transistor 121a is in an off state, the gate potential of the switch transistor 123 can be held for a long time.

The concentration of alkali metals or alkaline earth metals in the oxide semiconductor is preferably lower than or equal to $1\times10^{18}$ atoms/cm$^3$, more preferably lower than or equal to $2\times10^{16}$ atoms/cm$^3$. This is because carriers might be generated when an alkali metal or an alkaline earth metal is bonded to an oxide semiconductor, which causes an increase in the off-state current of the transistor.

The oxide semiconductor may contain nitrogen at a concentration of lower than or equal to $5\times10^{18}$ atoms/cm$^3$.

A material which can realize off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. A MEMS switch, for example, may be used instead of a transistor to break connection between wirings, whereby the gate potential of the switch transistor 123 can be held.

Figure 4:
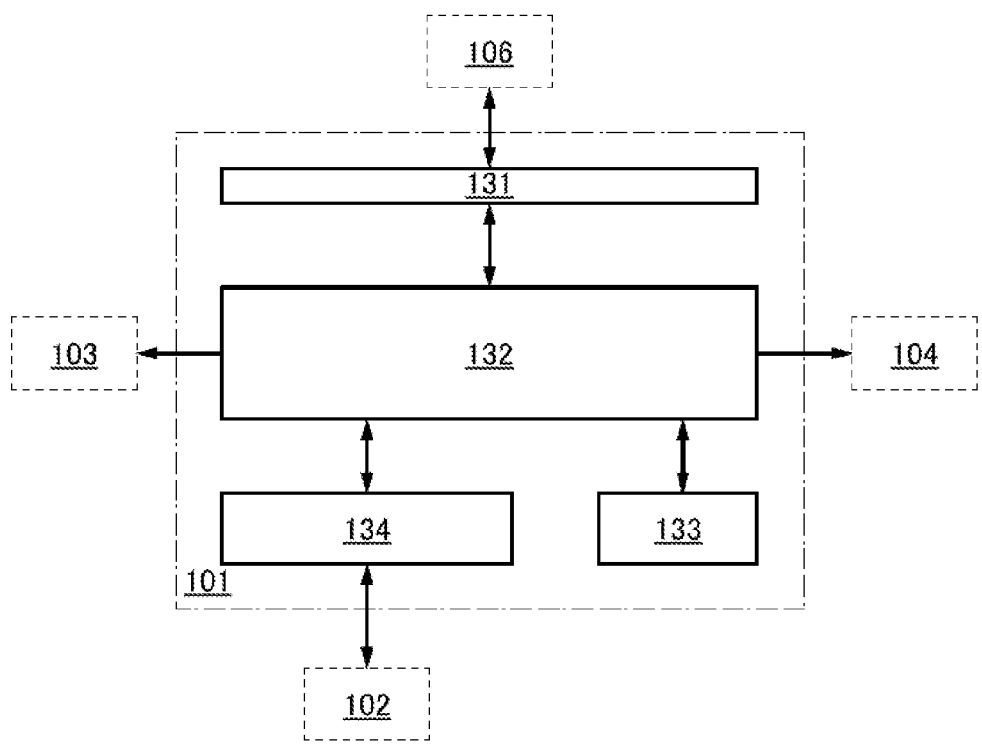
FIG. 4 is a block diagram illustrating an arithmetic state control circuit.

Next, a detailed structure of the arithmetic state control circuit 101 illustrated in FIG. 1 is described with reference to FIG. 4. The arithmetic state control circuit 101 in FIG. 4 includes an input/output portion 131, a control circuit portion 132, a timer circuit 133, and a reading/writing control circuit 134 for the state memory circuit.

The input/output portion 131 is a circuit to which an instruction signal is input from the command decoder circuit 106 and which outputs the instruction signal to the control circuit portion 132.

The control circuit portion 132 controls the configuration changing circuit 103 and the power supply control circuit 104 in accordance with the instruction signal from the input/output portion 131 and the data stored in the state memory circuit 102 which is input through the reading/writing control circuit 134 for the state memory circuit. For example, in the case of an instruction to output an arithmetic result of OR operation of input data as output data, the control circuit portion 132 controls the configuration changing circuit 103 and the power supply control circuit 104 in accordance with data on whether an arithmetic circuit capable of performing OR operation is present in the arithmetic circuit portion 105, based on the data stored in the state memory circuit 102.

The timer circuit 133 detects the time when each of the arithmetic circuits 109a and 109b performs operation for the last time. The timer circuit 133 may include a counter circuit or the like.

The reading/writing control circuit 134 for the state memory circuit reads stored data for controlling the configuration changing circuit 103 and the power supply control circuit 104 from the state memory circuit 102, and writes data on last use, data on use enablement, data on configuration, data on use frequency, and the like of the arithmetic circuits 109a and 109b in accordance with the instruction signal.

Figure 5:
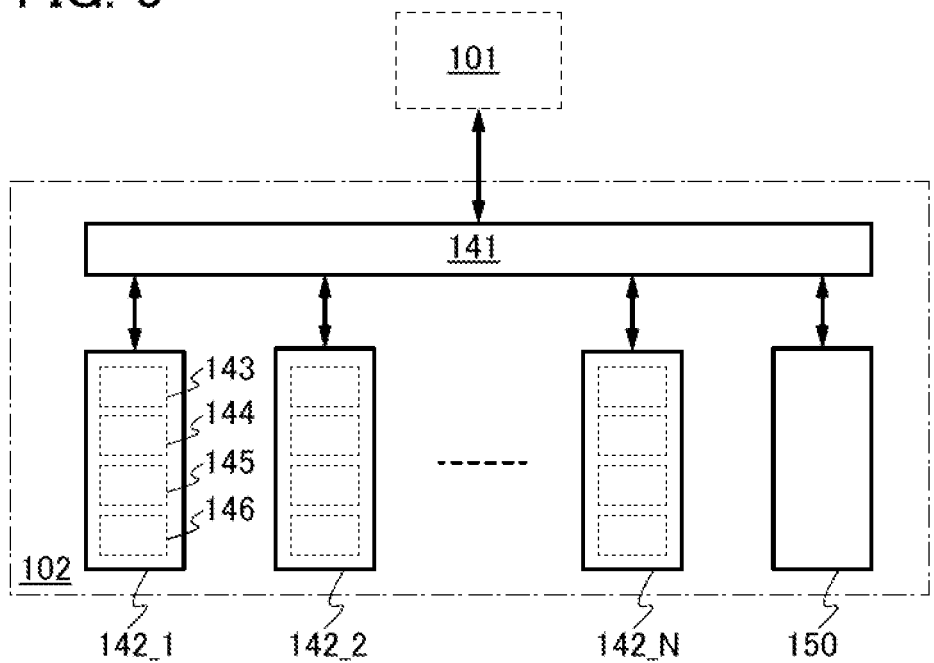
FIG. 5 is a block diagram illustrating a state memory circuit.

FIG. 5 shows a detailed structure of the state memory circuit 102 illustrated in FIG. 1. The state memory circuit 102 illustrated in FIG. 5 includes an input/output portion 141 and a plurality of memory circuits 142_1 to 142_N (N is a natural number) and 150. Although the plurality of memory circuits 142_1 to 142_N and 150 is illustrated in FIG. 5, one memory region in a memory circuit may be divided into plural regions which have functions similar to functions of the plurality of memory circuits 142_1 to 142_N and 150.

The input/output portion 141 is a circuit to which a write signal is input from the arithmetic state control circuit 101 and which outputs stored data to the arithmetic state control circuit 101.

The state memory circuit 102 includes the plurality of memory circuits 142_1 to 142_N corresponding to the plurality of arithmetic circuits 109a and 109b in the arithmetic circuit portion 105 so that data on states of the plurality of arithmetic circuits 109a and 109b is stored. Each of the plurality of memory circuits 142_1 to 142_N includes a region 143 storing data on configuration of a corresponding arithmetic circuit, a region 144 storing data on use status (use enablement) of the corresponding arithmetic circuit, a region 145 storing data on use frequency of the corresponding arithmetic circuit, and a region 146 storing data on last use of the corresponding arithmetic circuit. Data is written to each of the regions 143 to 146 by the arithmetic state control circuit 101 and read by the arithmetic state control circuit 101.

Further, the memory circuit 150 is a region storing data on a time in which an arithmetic circuit is not used, that is, a use interval in arithmetic operation such as NAND, NOR, AND, OR, XOR, ADD, SUB, MULTI, DIV, NOT, SHIFT, or COMP.

Note that data on a logic state of the corresponding arithmetic circuit 109a or 109b on the basis of the configuration data written thereto is stored in the region 143 storing the data on the configuration. Data on the use statues (use enablement) of the corresponding arithmetic circuit 109a or 109b is stored in the region 144 storing the data on the use status. Data on use frequency of an arithmetic circuit, such as high use frequency, middle use frequency, or low use frequency is stored in the region 145 storing the data on the use frequency. Data on the time when the arithmetic circuit 109a or 109b is used after change of its logic state is stored in the region 146 storing the data on the last use.

The non-volatile memory circuit 112a and the volatile memory circuit 112b in FIG. 1 can be used as appropriate as the plurality of memory circuits 142_1 to 142_N.

Figure 6:
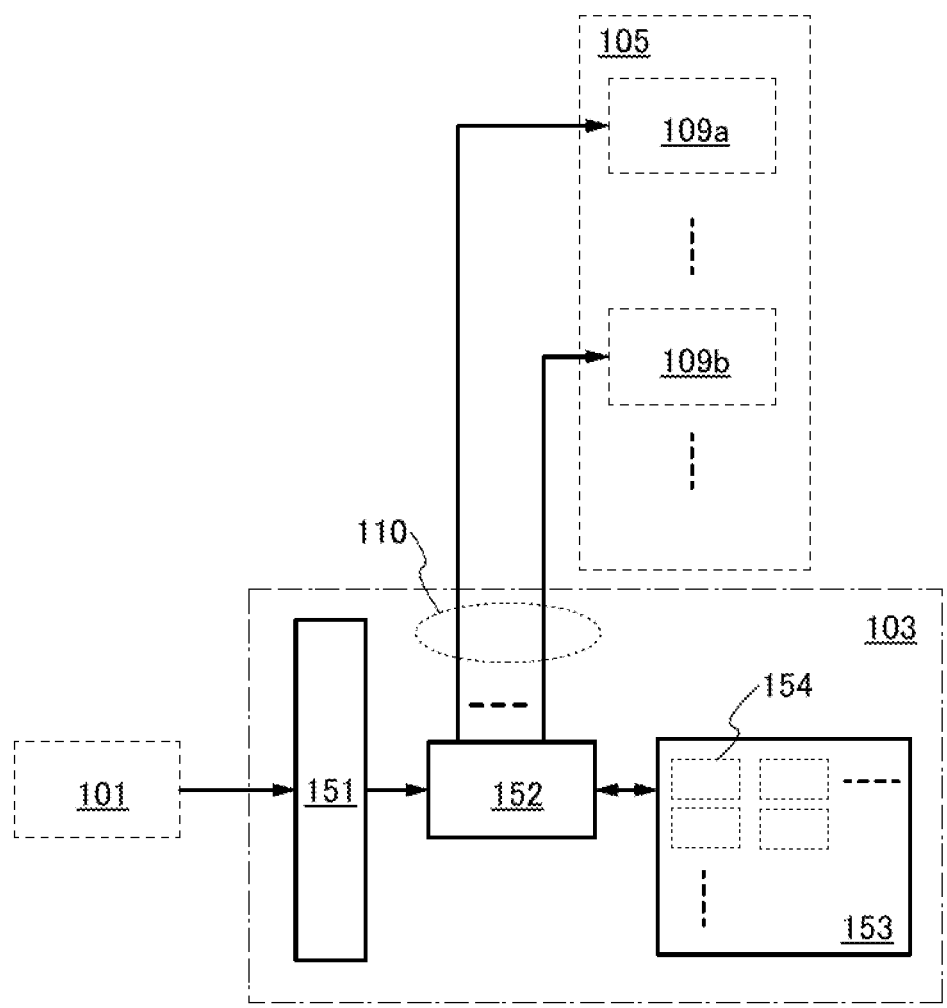
FIG. 6 is a block diagram illustrating a configuration changing circuit.

Next, a detailed structure of the configuration changing circuit 103 in FIG. 1 is described with reference to FIG. 6. The configuration changing circuit 103 in FIG. 6 includes an input/output portion 151, a configuration data writing control circuit 152, and a configuration data memory circuit 153.

The input/output portion 151 is a circuit to which a control signal is input from the arithmetic state control circuit 101 and which outputs the control signal to the configuration data writing control circuit 152.

The configuration data writing control circuit 152 reads configuration data from the configuration data memory circuit 153 storing some pieces of configuration data by which the logic states of the arithmetic circuits 109a and 109b can be changed, and outputs the configuration data to predetermined arithmetic circuits 109a and 109b in the arithmetic circuit portion 105 through the configuration bus 110, in accordance with the control signal from the arithmetic state control circuit 101.

The configuration data memory circuit 153 includes memory regions 154 each storing configuration data by which the logic states of the arithmetic circuits 109a and 109b can be changed. The configuration data memory circuit 153 reads predetermined configuration data in accordance with control by the configuration data writing control circuit 152 and outputs the configuration data to the configuration data writing control circuit 152.

Note that the non-volatile memory circuit 112a or the volatile memory circuit 112b in FIG. 1 can be used as appropriate as the configuration data memory circuit 153.

Figure 7:
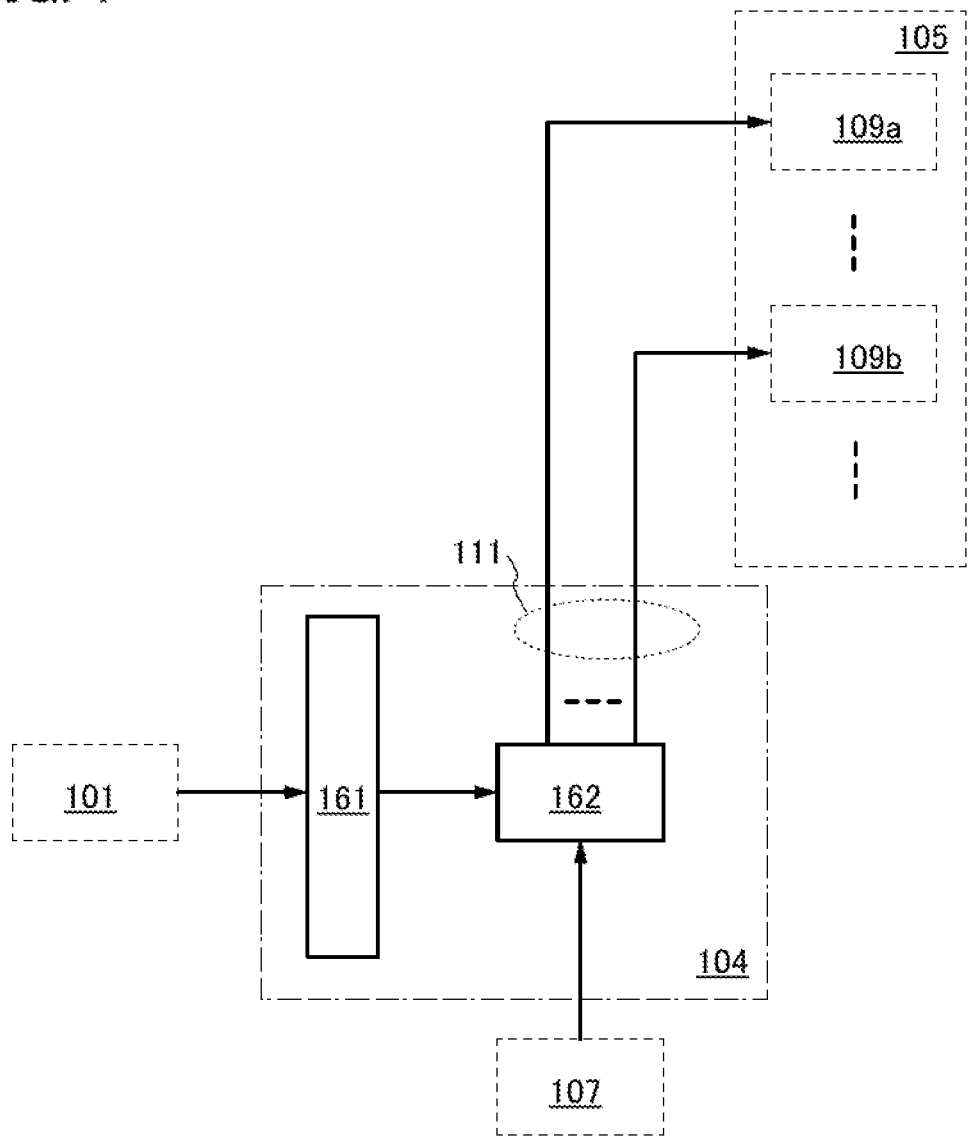
FIG. 7 is a block diagram illustrating a power supply control circuit.

Next, a detailed structure of the power supply control circuit 104 in FIG. 1 is described with reference to FIG. 7. The power supply control circuit 104 in FIG. 7 includes an input/output portion 161 and a power supply switch circuit 162.

The input/output portion 161 is a circuit to which a control signal is input from the arithmetic state control circuit 101 and which outputs the control signal to the power supply switch circuit 162.

The power supply switch circuit 162 controls, in accordance with the control signal from the arithmetic state control circuit 101, whether the power supply voltage from the power supply circuit 107 is supplied to each of the arithmetic circuits 109a and 109b in the arithmetic circuit portion 105 or supply of the power supply voltage is stopped. Specifically, the power supply switch circuit 162 controls whether the power supply voltage is supplied to each of the arithmetic circuits 109a and 109b or supply of the power supply voltage is stopped in accordance with the use frequency of each of the arithmetic circuits. The power supply switch circuit 162 changes conduction states of switches or the like for individually controlling power supply voltage supplied to the arithmetic circuits 109a and 109b and controls supply of the power supply voltage through the power supply voltage bus 111 and stop of the supply of the power supply voltage.

Next, specific structures of the non-volatile memory circuit 112a and the switch arithmetic circuit 113a illustrated in FIG. 3 are described with reference to FIG. 8A.

Figure 8A:
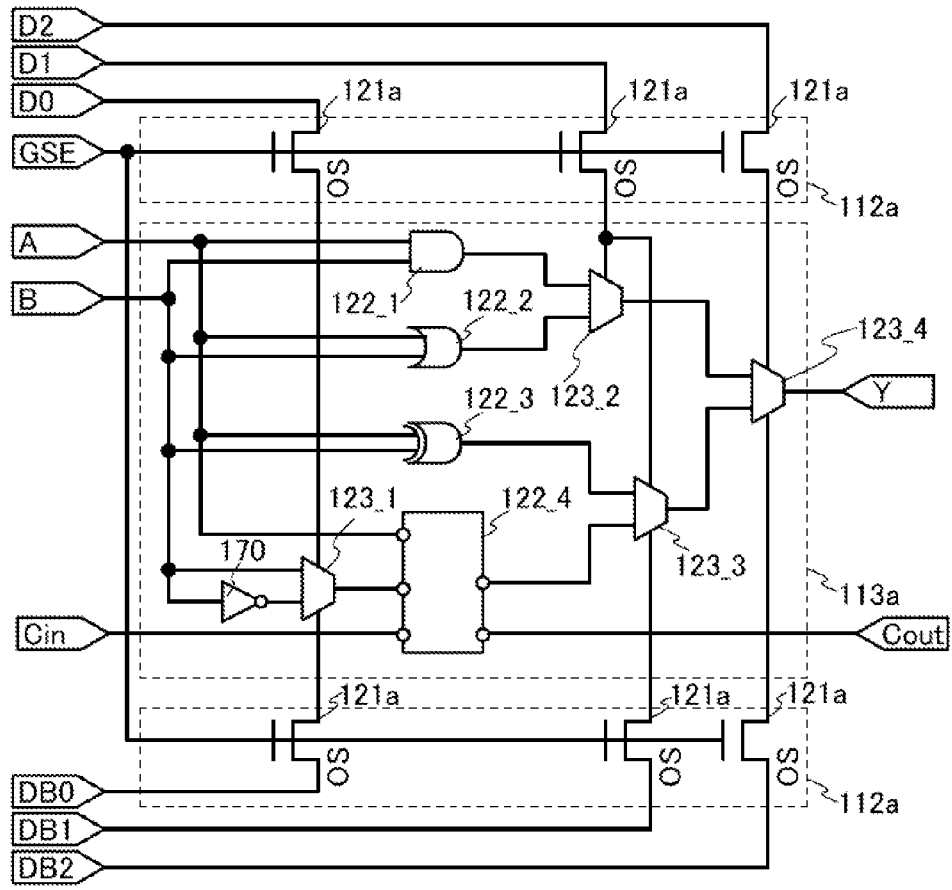
FIGS. 8A to 8C are circuit diagrams illustrating an arithmetic circuit.

An example illustrated in FIG. 8A includes, instead of the switch transistors 123, selector circuits 123_1 to 123_4 each including an analog switch in the switch arithmetic circuit 113a. In this example, three pairs of transistors 121a are provided in order to control conduction states of the analog switches in the selector circuits and configuration data D0 to D2 and DB0 to DB2 are supplied as configuration data of the transistors 121a. Further, in this example, a gate selection control signal GSE is supplied as a signal for controlling conduction states of the transistors 121a.

Note that the configuration data D0 to D2 and DB0 to DB2 and the gate selection control signal GSE are supplied through the configuration bus 110 illustrated in FIG. 1. Note that each signal is either a signal at an H-level potential (H signal) or a signal at an L-level potential (L signal). Note that the L signal is preferably a signal at a ground potential.

Figure 8B:
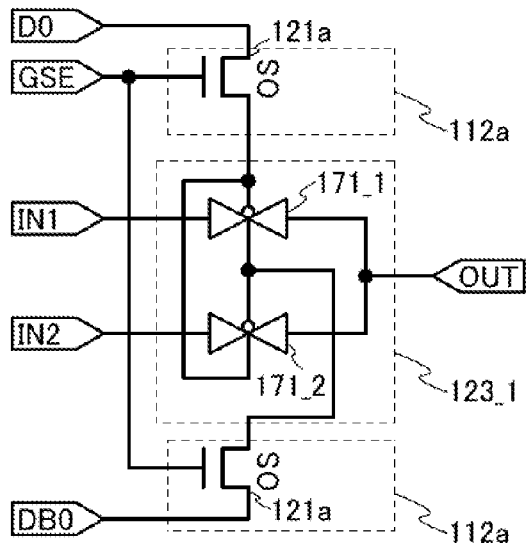

FIG. 8B illustrates an example of a circuit structure of the selector circuit 123_1. The selector circuit 123_1 in FIG. 8B includes an analog switch 171_1 and an analog switch 171_2. Each of the analog switches 171_1 and 171_2 includes an n-channel transistor and a p-channel transistor in combination. Therefore, in the example illustrated in FIG. 8A, in the memory circuit 112a, a pair of transistors 121a is provided for the selector circuit 123_1. When the configuration data D0 is supplied from one of a source and a drain of one of the pair of the transistors 121a and the configuration data DB0 is supplied from one of a source and a drain of the other of the pair of the transistors 121a and thus the analog switch 171_1 or the analog switch 171_2 is turned on, a signal of an input terminal N1 or a signal of an input terminal IN2 is output to an output terminal OUT.

In the example illustrated in FIG. 8A, a logic circuit 122_1 performing logical AND operation, a logic circuit 1222 performing logical OR operation, a logic circuit 122_3 performing logical XOR operation, and a logic circuit 1224 performing add operation are included in the switch arithmetic circuit 113a. In addition, in the example illustrated in FIG. 8A, an inverter circuit 170 is provided on the input terminal side of the logic circuit 122_4 so that subtraction operation is performed by the logic circuit 122_4. Note that a signal CM input to the logic circuit 1224 is a carry signal in the add operation, and a signal Cout is output from the logic circuit 122_4 if carry exists.

In the example illustrated in FIG. 8A, a connection state is changed by changing the configuration data D0 to D2 and DB0 to DB2 as shown in Table 1; thus, a logic state can be changed. Note that "1" means the H signal and "0" means the L signal in Table 1. The configuration data is changed as shown in Table 1, whereby the conduction states of the selector circuits serving as switch transistors are changed and the logic state can be changed accordingly. Further, data input from input terminals A and B can be obtained as data output from an output terminal Y.

TABLE 1

|  | Configuration data | | | | | |
| --- | --- | --- | --- | --- | --- | --- |
|  | D0 | D1 | D2 | DB0 | DB1 | DB2 |
| AND | 0 | 0 | 0 | 1 | 1 | 1 |
| OR | 0 | 1 | 0 | 1 | 1 | 1 |
| XOR | 0 | 0 | 1 | 1 | 1 | 0 |
| Add | 0 | 1 | 1 | 1 | 0 | 0 |
| Subtraction | 1 | 1 | 1 | 0 | 0 | 0 |

Figure 8C:
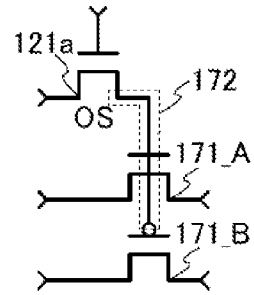

When the transistors (e.g., an n-channel transistor and a p-channel transistor) included in each of the analog switches 171_1 and 171_2 in FIG. 8B are a transistor 171_A and a transistor 171_B, one of a source electrode and a drain electrode of the transistor 121a is connected to gates of the transistors 171_A and 171_B as illustrated in FIG. 8C. As described above, a transistor with small off-state current is used as the transistor 121a included in the memory circuit 112a in this embodiment. Accordingly, gate potentials of the transistors 171_A and 171_B (a node 172 in FIG. 8C) in FIG. 8C can be held. Thus, with the structure illustrated in FIG. 8A, connection states of the logic circuits 122 can be held by making the transistors 121a turn off even while power supply voltage is not supplied.

Further, in the structure in FIG. 8C, the gate potentials of the transistors 171_A and 171_B are held owing to small off-state current of the transistor 121a, so that configuration data can be held by holding of the potential. Accordingly, deterioration of a memory element can be reduced in the structure of FIG. 8A in which rewriting and holding of configuration data are performed by switching between an on state and an off state of the transistors, compared to a structure in which rewriting and holding of configuration data are performed by repeated structure change.

Although the specific structure of the arithmetic circuit 109a is described here, the arithmetic circuit 109b is obtained by replacing the transistors 121a of the memory circuit 112a illustrated in FIG. 8A with SRAMs.

Next, the use frequency and the power supply control of the arithmetic circuits of the programmable logic device 100 illustrated in FIG. 1 are described with reference to FIGS. 9A to 9C and FIG. 10.

Note that in this specification, stop of supply of a signal or power supply voltage means that a signal or power supply voltage is not supplied to a wiring for supplying the signal or the power supply voltage.

Figure 9A:
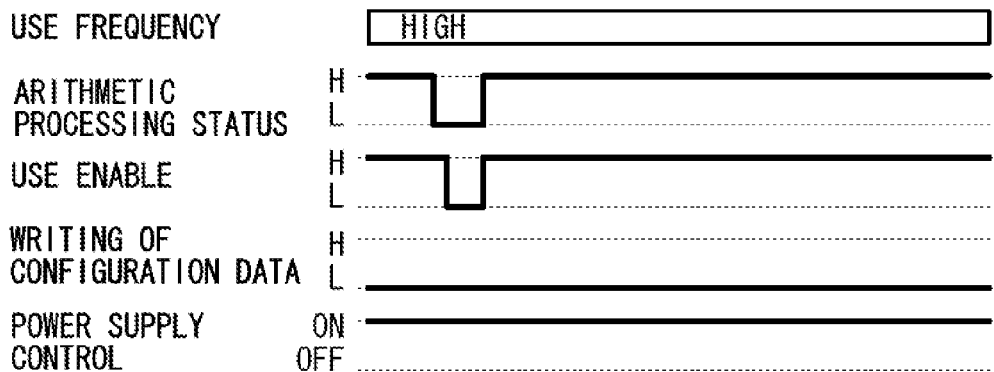
FIGS. 9A to 9C are each a timing chart showing use frequency and power supply control of an arithmetic circuit of a programmable logic device.
Figure 9B:
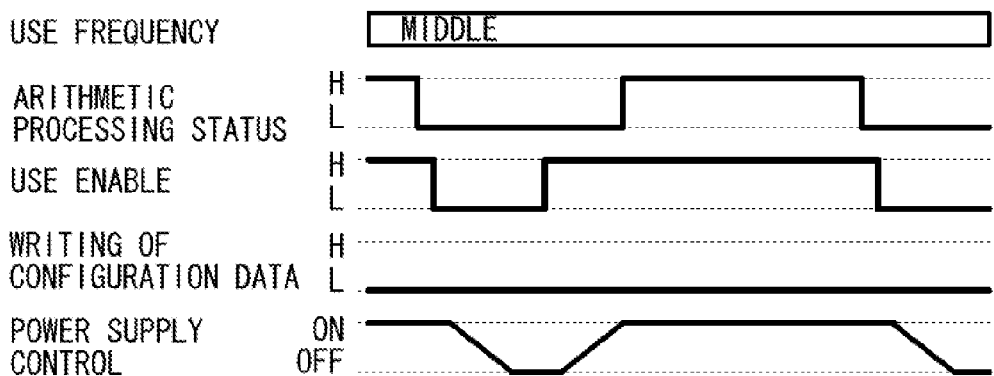
Figure 9C:
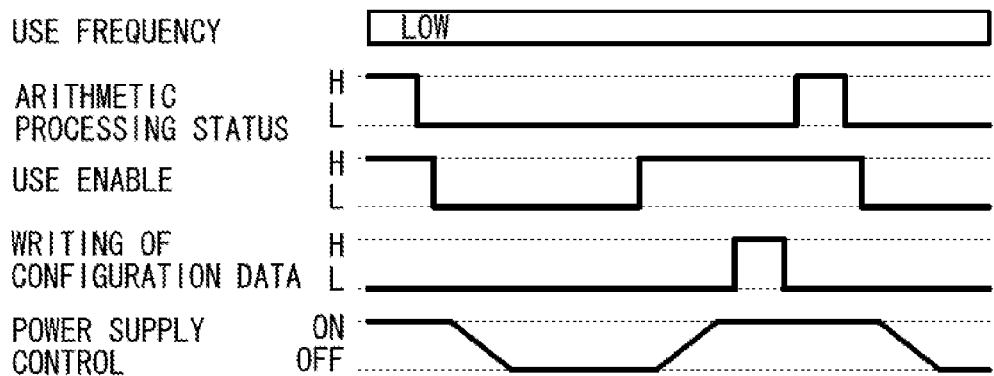

In FIGS. 9A to 9C, in an arithmetic processing status, H means that an arithmetic circuit is performing arithmetic processing, and L means that an arithmetic circuit is not performing arithmetic processing. In use enablement, H is data indicating that an arithmetic circuit is performing arithmetic processing or that an arithmetic circuit is to perform arithmetic processing, and L is data indicating that an arithmetic circuit is not performing arithmetic processing or that arithmetic circuit is not to perform arithmetic processing. In writing of configuration data, H means a state in which configuration data is written to a memory circuit, and L means a state in which configuration data is not written to a memory circuit. In power supply control, ON means a state in which power supply voltage is supplied to an arithmetic circuit (on state), OFF means a state in which supply of power supply voltage to an arithmetic circuit is stopped (off state), a diagonal line from ON to OFF means a transition state from an on state to an off state, and a diagonal line from OFF to ON means a transition state from an off state to an on state.

FIG. 9A is a timing chart showing operation of an arithmetic circuit with high use frequency. The arithmetic circuit 109a with high use frequency includes the non-volatile memory circuit 112a. Here, operation in which the processing status is changed from H to L to H in this order is described.

The processing status is changed from H to L when the previous arithmetic processing of an arithmetic circuit is terminated (step S701 in FIG. 10). Note that a period in which the processing status is L corresponds to the use interval T_h in FIG. 2. Then, the arithmetic state control circuit 101 determines that the arithmetic processing status is changed from H to L, and data of the corresponding arithmetic circuit 109a, here, the use enablement, which is stored in the state memory circuit 102, is changed from H to L (step S702 in FIG. 10).

Then, when the arithmetic state control circuit 101 determines that the use frequency of an arithmetic circuit which is to perform arithmetic processing next is high (step S703 in FIG. 10), the arithmetic circuit 109*a* remains on (step S705 in FIG. 10).

Next, the arithmetic state control circuit 101 determines a startup timing of the arithmetic circuit which is to perform arithmetic processing, and then the data of the corresponding arithmetic circuit 109*a*, here, the use enablement, which is stored in the state memory circuit 102, is changed from L to H (step S706 in FIG. 10). Then, the arithmetic processing status of the arithmetic circuit 109*a* is changed from L to H. Next, data is input to the arithmetic circuit 109*a* from the data input/output bus 108, and the arithmetic circuit 109*a* executes arithmetic processing (step S710 in FIG. 10). Note that since the use frequency is high, the period in which the processing status is L, that is, the use interval T_h, is short.

The arithmetic circuit 109*a* with high use frequency has a short period L in which arithmetic processing is not executed. Therefore, the arithmetic circuit 109*a* is in an on state in which power supply voltage is always supplied. Further, since the arithmetic circuit 109*a* is frequently used, configuration data has already been stored in the non-volatile memory circuit 112*a*. Accordingly, configuration data does not always need to be written to the memory circuit 112*a* each time new arithmetic processing is executed.

FIG. 9B is a timing chart showing operation of an arithmetic circuit with middle use frequency. The arithmetic circuit 109*a* with middle use frequency includes the non-volatile memory circuit 112*a*. Here, operation in which the arithmetic processing status is changed from H to L to H to L in this order is described.

The arithmetic processing status is changed from H to L when the previous arithmetic processing of an arithmetic circuit is terminated (step S701 in FIG. 10). Note that a period in which the processing status is L corresponds to the use interval T_m in FIG. 2. Then, the arithmetic state control circuit 101 determines that the arithmetic processing status of the arithmetic circuit 109*a* is changed from H to L, and data of the corresponding arithmetic circuit 109*a*, here, the use enablement, which is stored in the state memory circuit 102, is changed from H to L (step S702 in FIG. 10).

Then, when the arithmetic state control circuit 101 determines that the use frequency of an arithmetic circuit which is to perform arithmetic processing next is low or middle (step S703 in FIG. 10), the power supply control circuit 104 makes the power supply circuit 107 stop supplying power supply voltage to the arithmetic circuit 109*a*. As a result, the arithmetic circuit 109*a* is in a transition state from an on state to an off state, and then in an off state (step S704 in FIG. 10).

Next, the arithmetic state control circuit 101 determines a startup timing of the arithmetic circuit which is to perform arithmetic processing, and then the data of the corresponding arithmetic circuit 109*a*, here, the use enablement, which is stored in the state memory circuit 102, is changed from L to H (step S706 in FIG. 10). When the arithmetic state control circuit 101 determines that the data on the use enablement stored in the state memory circuit 102 is changed from L to H, the power supply control circuit 104 allows the power supply circuit 107 to supply power supply voltage to the arithmetic circuit 109*a*. As a result, the arithmetic circuit 109*a* is in a transition state from an off state to an on state, and then in an on state (step S707 in FIG. 10).

Next, when the use frequency of an arithmetic circuit which is to perform arithmetic processing is determined to be middle (step S708 in FIG. 10), the arithmetic processing status of the arithmetic circuit 109*a* is changed from L to H. Next, data is input to the arithmetic circuit 109*a* from the data input/output bus 108, and arithmetic processing is executed (step S710 in FIG. 10).

In the case where the arithmetic processing status is changed from H to L in a later step, operation similar to the above-described case in which the arithmetic processing status is changed from H to L is performed.

Since the arithmetic circuit with middle use frequency has a longer period during which arithmetic processing is not executed than the arithmetic circuit with high use frequency, that is, the use interval T_m is long, the arithmetic circuit with middle use frequency can be turned off during the use interval T_m. Thus, the power consumption of the arithmetic circuit can be reduced. Further, since the arithmetic circuit is relatively frequently used, configuration data has already been stored in the non-volatile memory circuit. Accordingly, configuration data does not always need to be written each time new arithmetic processing is executed.

FIG. 9C is a timing chart showing operation of an arithmetic circuit with low use frequency. The arithmetic circuit 109*b* with low use frequency includes the volatile memory circuit 112*b*. Here, operation in which the arithmetic processing status is changed from H to L to H to L in this order is described.

The processing status is changed from H to L when the previous arithmetic processing of an arithmetic circuit is terminated (step S701 in FIG. 10). Note that a period in which the processing status is L corresponds to the use interval T_1 in FIG. 2. Then, the arithmetic state control circuit 101 determines that the arithmetic processing status of the arithmetic circuit 109*b* is changed from H to L, and data of the corresponding arithmetic circuit 109*b*, here, the use enablement, which is stored in the state memory circuit 102, is changed from H to L (step S702 in FIG. 10).

Then, when the arithmetic state control circuit 101 determines that the use frequency of an arithmetic circuit which is to perform arithmetic processing next is low (step S703 in FIG. 10), the power supply control circuit 104 makes the power supply circuit 107 stop supplying power supply voltage to the arithmetic circuit 109*b*. As a result, the arithmetic circuit 109*b* is in a transition state from an on state to an off state, and then in an off state (step S704 in FIG. 10).

Next, the arithmetic state control circuit 101 determines a startup timing of the arithmetic circuit which is to perform arithmetic processing, and then the data of the corresponding arithmetic circuit 109*b*, here, the use enablement, which is stored in the state memory circuit 102, is changed from L to H (step S706 in FIG. 10). When the arithmetic state control circuit 101 determines that the data on the use enablement stored in the state memory circuit 102 is changed from L to H, the power supply control circuit 104 allows the power supply circuit 107 to supply power supply voltage to the arithmetic circuit 109*b*. As a result, the arithmetic circuit 109*b* is in a transition state from an off state to an on state, and then in an on state (step S707 in FIG. 10).

Next, when the use frequency of the arithmetic circuit which is to perform arithmetic processing is determined to be low (step S708 in FIG. 10), configuration data is output from the configuration changing circuit 103 to the arithmetic circuit 109*b*, the writing of the configuration data is changed from L to H, and the configuration data is overwritten to the volatile memory circuit 112*b* included in the arithmetic circuit 109*b* (step S709 in FIG. 10). After overwriting, the writing of the configuration data is changed from H to L.

Then, the arithmetic processing status of the arithmetic circuit 109b is changed from L to H. In other words, configuration data is input to the arithmetic circuit 109b from the data input/output bus 108, and arithmetic processing is executed in accordance with the written data (step S710 in FIG. 10).

In the case where the arithmetic processing status is changed from H to L in a later step, operation similar to the above-described case in which the arithmetic processing status is changed from H to L is performed.

Since the arithmetic circuit with low use frequency has a longer period during which arithmetic processing is not executed than the arithmetic circuit with high use frequency and the arithmetic circuit with middle use frequency, that is, the use interval T_1 is long, the arithmetic circuit with low use frequency can be turned off during the use interval T_1. In contrast, since configuration data is written to the volatile memory circuit included in the arithmetic circuit, configuration data needs to be rewritten every time the arithmetic circuit is used. However, since the use frequency of the arithmetic circuit is low and a rewriting period of the volatile memory circuit capable of operating at high speed is short, power consumption can be reduced and high-speed operation is possible.

Next, writing operation and overwriting operation of the programmable logic device 100 illustrated in FIG. 1 are described with reference to FIG. 11 and FIGS. 12A to 12C.

First, arithmetic circuit necessary for the programmable logic device 100 to carry out an instruction is determined (step S801).

Next, the state memory circuit 102 is searched for data on the configuration, particularly data on the use frequency and data on the last use of all of the arithmetic circuits 109a and 109b (step S802).

Then, determination is made whether data on configuration of the corresponding arithmetic circuit is detected among the data of all the arithmetic circuits 109a and 109b (step S803). Note that the step S803 is a step for detecting whether an arithmetic circuit 109a or 109b in a connection state capable of performing logical OR operation exists in all of the arithmetic circuits 109a and 109b in the case where logical OR operation is preferably performed on input data, for example. Therefore, operation differs depending on whether or not data on configuration of the corresponding arithmetic circuit is detected among data of all of the arithmetic circuits 109a and 109b.

First, the case where data of the corresponding arithmetic circuit is detected in the step S803 is described. In this case, data is input to the arithmetic circuit 109a or 109b from the data input/output bus 108 and given arithmetic processing is performed (step S809).

Next, the case where data of the corresponding arithmetic circuit is not detected in the step S803 is described. In this case, the use frequency of the arithmetic circuit to which data is to be written is determined on the basis of the data stored in the memory circuit 150 illustrated in FIG. 5 (step S804). In the case where the use frequency of the arithmetic circuit to which data is to be written is high or middle, in a step S805, the non-volatile arithmetic circuit 109a is selected as an object to which data is to be written. In the case where the use frequency of the arithmetic circuit to which data is to be written is low, in a step S811, the arithmetic circuit 109b including the volatile memory circuit 112b is selected as an object to which data is to be written.

Next, whether there is a free space in the memory circuit 112a or 112b included in the arithmetic circuit 109a or 109b to which data is to be written is determined in a step S806. In the case where there is a free space, in a step S807, the data of the corresponding arithmetic circuit, which is stored in the state memory circuit 102, is updated to data on configuration corresponding to the state in which writing in a step S808 is terminated. Next, in the step S808, configuration data is written to the memory circuit 112a or 112b included in the arithmetic circuit 109a or 109b.

Now, the case where there is no free space in the corresponding object to which data is to be written in the step S806 is described. In this case, the state memory circuit 102 is searched for data on the last use of all of the arithmetic circuits so that the arithmetic circuit 109a or 109b with the longest time passing since the last use is detected (step S821).

Next, in a step S822, the data on configuration of the corresponding arithmetic circuit, which is stored in the state memory circuit 102, is changed to data on configuration corresponding to the state where writing in a step S823 is terminated. Next, configuration data is overwritten to the memory circuit 112a or 112b included in the arithmetic circuit 109a or 109b in the step S823.

Next, data is input to the arithmetic circuit 109a or 109b from the data input/output bus 108 and given arithmetic processing is performed (step S809).

The above is the description of the operation of writing and overwriting configuration data on the basis of the use frequency in the programmable logic device.

Figure 11:
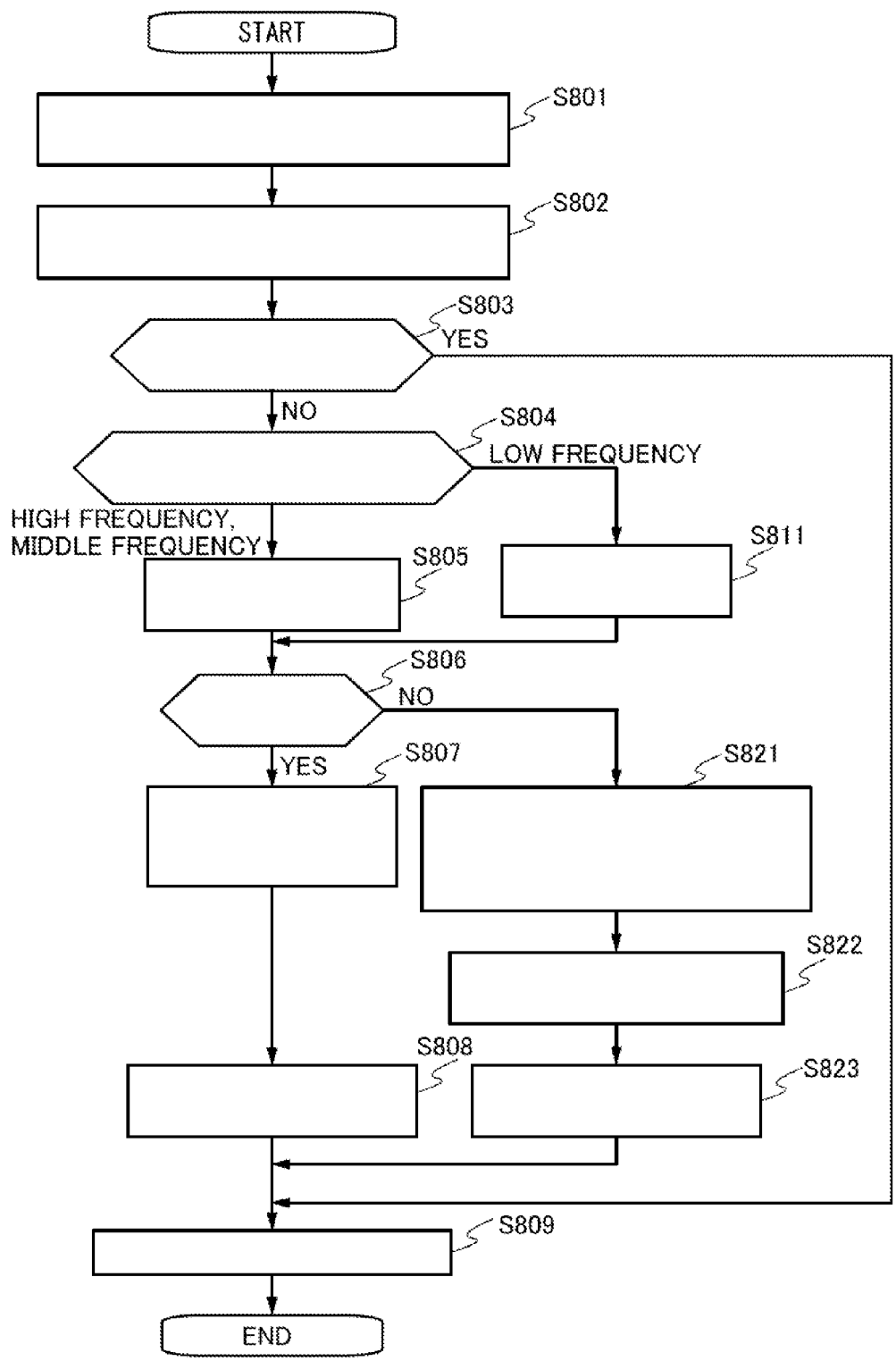
FIG. 11 is a flow chart showing writing operation and overwriting operation of an arithmetic circuit of a programmable logic device.
Figure 12A:
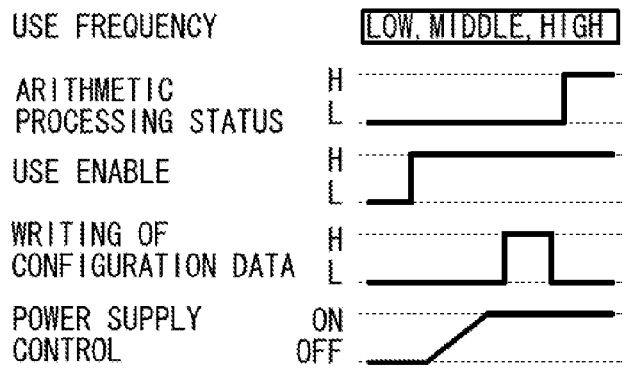
FIGS. 12A to 12C are each a timing chart showing writing operation and overwriting operation of an arithmetic circuit of a programmable logic device.

Here, the processing status, the use enablement, the writing of the configuration data, and the power supply control of the arithmetic circuits 109a and 109b with high, middle, and low use frequency in the steps S807 and S808 (operation of writing configuration data) in FIG. 11 are described with reference to FIG. 12A.

In the arithmetic circuit determined to have a free space, the data of the arithmetic circuit, which is stored in the state memory circuit 102, is changed by the arithmetic state control circuit 101, so that the use enablement is changed from L to H (step S807).

Further, the arithmetic state control circuit 101 determines that data on the use enablement stored in the state memory circuit 102 is changed from L to H, and the power supply control circuit 104 allows the power supply circuit 107 to supply power supply voltage to the arithmetic circuit 109a or 109b. As a result, the arithmetic circuit is in a transition state from an off state to an on state, and then in an on state.

Further, the arithmetic state control circuit 101 determines that the data on the use enablement stored in the state memory circuit 102 is changed from L to H, the configuration changing circuit 103 outputs configuration data to the arithmetic circuit 109a or 109b, and the writing of the configuration data is changed from L to H. Next, the configuration data is written to the memory circuit 112a or 112b included in the arithmetic circuit 109a or 109b (step S808).

After writing, the writing of the configuration data is changed from H to L. Further, the arithmetic processing status of the arithmetic circuit is changed from L to H. Next, data is input to the arithmetic circuit 109a or 109b from the data input/output bus 108 and arithmetic processing is executed.

The above is the description of the writing operation in the programmable logic device.

Next, the processing status, the use enablement, the writing of the configuration data, and the power supply control of the arithmetic circuits 109a and 109b with high and middle use frequency in the steps S821 to S823 and the step S809 (operation of overwriting configuration data) in FIG. 11 are described with reference to FIGS. 12B and 12C.

Figure 12B:
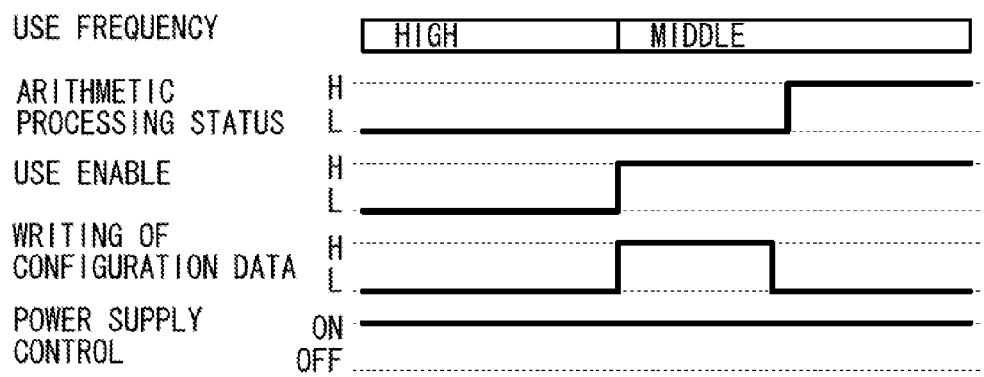

FIG. 12B is a timing chart of operation of overwriting configuration data of an arithmetic circuit with middle frequency to an arithmetic circuit with high frequency which is detected in the step S821 in FIG. 11 as an arithmetic circuit having the longest time passing since the last use as a result of searching the state memory circuit 102 for data on the last use of all of the arithmetic circuits 109a and 109b.

In the step S821, in the case where an arithmetic circuit with high use frequency is detected as the arithmetic circuit 109a having the longest time passing since the last use, a signal for making the arithmetic circuit 109a perform arithmetic processing is input to the state memory circuit 102 from the arithmetic state control circuit 101, and the use enablement is changed from L to H (step S822).

Further, the arithmetic state control circuit 101 determines that the data on the use enablement stored in the state memory circuit 102 is changed from L to H, the configuration changing circuit 103 outputs configuration data to the arithmetic circuit 109a, and the writing of the configuration data is changed from L to H. Next, the configuration data is overwritten to the non-volatile memory circuit 112a included in the arithmetic circuit 109a (step S823).

After overwriting, the writing of the configuration data is changed from H to L. Further, the arithmetic processing status of the arithmetic circuit 109a is changed from L to H. Next, data is input to the arithmetic circuit 109a from the data input/output bus 108, and arithmetic processing is executed.

In the case of an arithmetic circuit with high use frequency, the arithmetic circuit is always in an on state. In the case of an arithmetic circuit with middle use frequency, the arithmetic circuit is in an on state from the start of overwriting of configuration data to the end of a period in which the arithmetic processing status is H. Further, during a period in which the arithmetic processing status is L, the arithmetic circuit with middle use frequency is in an off state as shown in FIG. 9B.

Figure 12C:
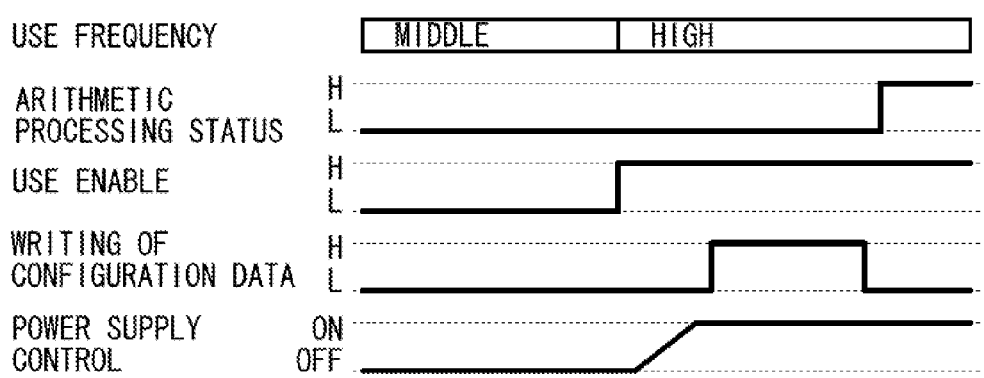

FIG. 12C is a timing chart of operation of overwriting configuration data of an arithmetic circuit with middle use frequency to an arithmetic circuit with middle use frequency which is detected in the step S821 in FIG. 11 as an arithmetic circuit having the longest time passing since the last use as a result of searching the state memory circuit 102 for data on the last use of all of the arithmetic circuits 109a and 109b.

In the step S821, in the case where the arithmetic circuit 109a with middle use frequency is detected as the arithmetic circuit 109a and 109b having the longest time passing since the last use, a signal for making the arithmetic circuit perform arithmetic processing is input to the state memory circuit 102 from the arithmetic state control circuit 101, and the use enablement is changed from L to H (step S822).

Further, the arithmetic state control circuit 101 determines that the data on the use enablement stored in the state memory circuit 102 is changed from L to H, and the power supply control circuit 104 allows the power supply circuit 107 to supply power supply voltage to the arithmetic circuit 109a. As a result, the arithmetic circuit 109a is in a transition state from an off state to an on state and then in an on state. Further, the arithmetic state control circuit 101 determines that the data on the use enablement stored in the state memory circuit 102 is changed from L to H, the configuration changing circuit 103 outputs configuration data to the arithmetic circuit 109a, and the writing of the configuration data is changed from L to H. Next, the configuration data is overwritten to the non-volatile memory circuit 112a included in the arithmetic circuit 109a.

After overwriting, the writing of the configuration data is changed from H to L. Further, the arithmetic processing status of the arithmetic circuit 109a is changed from L to H. In other words, configuration data is input to the arithmetic circuit 109a from the data input/output bus 108, and arithmetic processing is executed on the basis of the written data.

The above is the description of the writing operation and the overwriting operation depending on the use frequency of an arithmetic circuit in a programmable logic device. According to this embodiment, in the programmable logic device, supply and stop of power supply voltage can be controlled in accordance with the use frequency of an arithmetic circuit, and power consumption can be reduced while given arithmetic processing is performed. Further, since a volatile memory circuit is included as a memory circuit in an arithmetic circuit, the programmable logic device can operate at high speed.

Embodiment 2

In this embodiment, a method for manufacturing transistors included in the programmable logic device described in Embodiment 1 will be described with reference to FIG. 8C, FIGS. 13A to 13D, FIGS. 14A to 14C, FIGS. 15A to 15C, and FIGS. 16A and 16B. Here, a method for manufacturing the transistors 121a, 171_A, and 171_B illustrated in FIG. 8C will be described as an example.

Note that in each of FIGS. 13A to 13D, FIGS. 14A to 14C, FIGS. 15A to 15C, and FIGS. 16A and 16B, a cross-sectional view taken along line A-B corresponds to a cross-sectional view of a region where the transistor 121a whose channel formation region is formed in an oxide semiconductor film, the n-channel transistor 171_A, and the p-channel transistor 171_B are formed, and a cross-sectional view taken along line C-D corresponds to a cross-sectional view of the node 172 at which the one of the source electrode and the drain electrode of the transistor 121a whose channel formation region is formed in an oxide semiconductor film is connected to the gate electrode of the n-channel transistor 171_A. Note that although not directly illustrated, as illustrated in FIG. 8C, a gate electrode of the p-channel transistor 171_B is also connected to the node 172 in this embodiment.

Figure 13A:
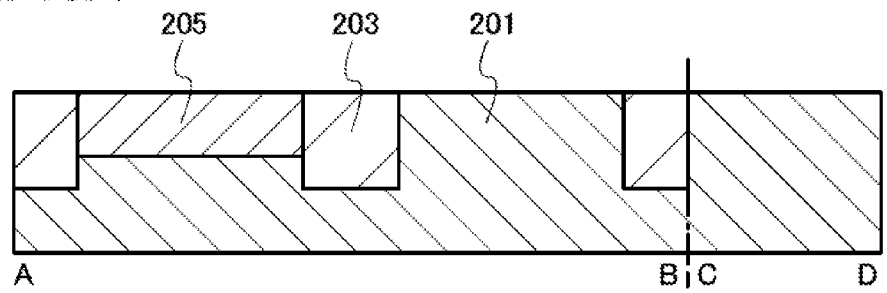
FIGS. 13A to 13D illustrate steps of manufacturing a programmable logic device.

As illustrated in FIG. 13A, an element isolation region 203 is formed in an n-type semiconductor substrate 201, and then a p-well region 205 is formed in part of the n-type semiconductor substrate 201.

As the n-type semiconductor substrate 201, a single crystal silicon substrate (a silicon wafer) having n-type conductivity or a compound semiconductor substrate (e.g., a SiC substrate, a sapphire substrate, or a GaN substrate) can be used.

Instead of the n-type semiconductor substrate 201, the following substrate may be used as an SOI substrate: a so-called separation by implanted oxygen (SIMOX) substrate which is formed in such a manner that after an oxygen ion is implanted into a mirror-polished wafer, an oxide layer is formed at a certain depth from the surface and defects generated in a surface layer are eliminated by high temperature heating; or an SOI substrate formed by a technique called a Smart-Cut method in which a semiconductor substrate is cleaved by utilizing growth of a minute void formed by implantation of a hydrogen ion, by heat treatment, an epitaxial layer transfer (ELTRAN: a registered trademark of Canon Inc.) method, or the like.

The element isolation region 203 is formed by a local oxidation of silicon (LOCOS) method, a shallow trench isolation (STI) method, or the like.

An impurity element imparting p-type conductivity, such as boron, is added to the p-well region 205 at a concentration of approximately higher than or equal to $5 \times 10^{15}$ cm$^{-3}$ and lower than or equal to $1 \times 10^{16}$ cm$^{-3}$. The p-well region 205 is formed in such a manner that a mask is formed over part of the semiconductor substrate 201 and an impurity element imparting p-type conductivity is added to part of the semiconductor substrate 201.

Note that although the n-type semiconductor substrate is used here, a p-type semiconductor substrate may be used and an n-well region to which an impurity element imparting n-type conductivity, such as phosphorus or arsenic, is added may be formed in the p-type semiconductor substrate.

Figure 13B:
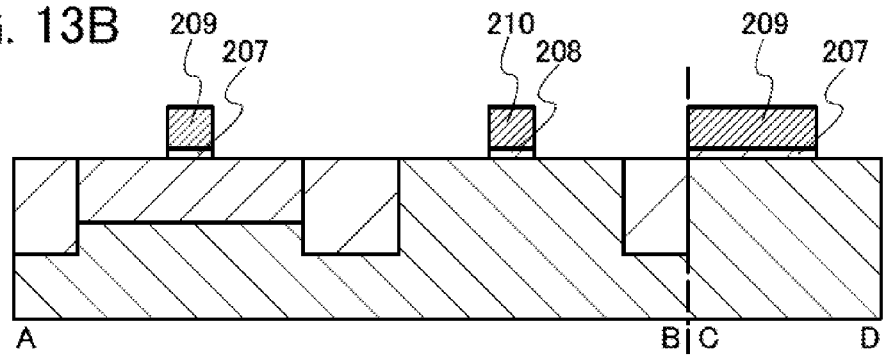

Next, as illustrated in FIG. 13B, gate insulating films 207 and 208 and gate electrodes 209 and 210 are formed over the semiconductor substrate 201.

First, a surface of the semiconductor substrate 201 is oxidized by heat treatment, so that a silicon oxide film is formed. Alternatively, a silicon oxide film is formed by a thermal oxidation method, and then a surface of the silicon oxide film is nitrided by nitridation treatment; thus, a stacked structure including the silicon oxide film and the silicon film containing oxygen and nitrogen (silicon oxynitride film) is formed. Next, part of the silicon oxide film or the silicon oxynitride film is selectively etched, so that the gate insulating films 207 and 208 are formed. Alternatively, the gate insulating films 207 and 208 are formed in such a manner that silicon oxide, silicon oxynitride, a metal oxide such as tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to have a thickness of 5 nm to 50 nm by a CVD method, a sputtering method, or the like, and then part thereof is selectively etched.

It is preferable that the gate electrodes 209 and 210 each be formed using a metal selected from tantalum, tungsten, titanium, molybdenum, chromium, niobium, and the like, or an alloy material or a compound material including any of the metals as its main component. Further, polycrystalline silicon to which an impurity such as phosphorus is added can be used. Alternatively, the gate electrodes 209 and 210 may have a stacked structure including a metal nitride film and a film of any of the above metals. As the metal nitride, tungsten nitride, molybdenum nitride, or titanium nitride can be used. When the metal nitride film is provided, adhesiveness of the metal film can be increased; accordingly, separation can be prevented.

The gate electrodes 209 and 210 are formed in such a manner that a conductive film is formed by a sputtering method, a CVD method, an evaporation method, or the like and then part of the conductive film is selectively etched.

Here, the surface of the semiconductor substrate 201 is oxidized by heat treatment, so that a silicon oxide film is formed; a conductive film including a stack of a tantalum nitride film and a tungsten film is formed over the silicon oxide film by a sputtering method; and then part of the silicon oxide film and part of the conductive film are selectively etched. Thus, the gate insulating films 207 and 208 and the gate electrodes 209 and 210 are formed.

Note that for high integration, a structure in which sidewall insulating films are not provided on side surfaces of the gate electrodes 209 and 210 is preferable. On the other hand, when the characteristics of the transistors have priority, sidewall insulating films may be provided on the side surfaces of the gate electrodes 209 and 210.

Figure 13C:
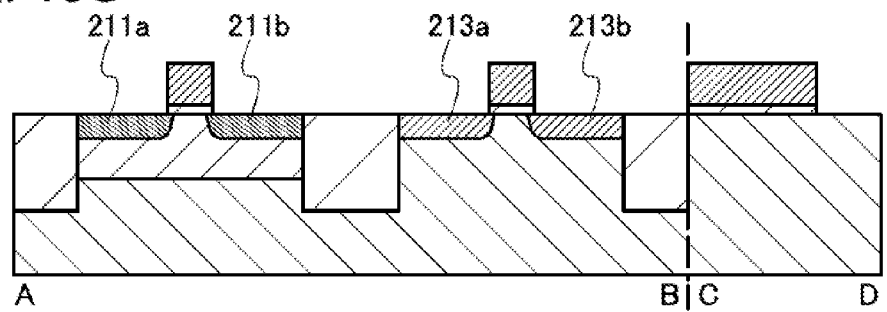

Next, as illustrated in FIG. 13C, an impurity element imparting p-type conductivity is added to the semiconductor substrate 201, so that p-type impurity regions 213a and 213b are formed. Further, an impurity element imparting n-type conductivity is added to the p-well region 205, so that n-type impurity regions 211a and 211b are formed. The concentration of the impurity element imparting n-type conductivity in the n-type impurity regions 211a and 211b is higher than or equal to $1 \times 10^{19}/cm^3$ and lower than or equal to $1 \times 10^{21}/cm^3$, and the concentration of the impurity element imparting p-type conductivity in the p-type impurity regions 213a and 213b is higher than or equal to $1 \times 10^{19}/cm^3$ and lower than or equal to $1 \times 10^{21}/cm^3$. The impurity element imparting n-type conductivity and the impurity element imparting p-type conductivity are added to the p-well region 205 and the semiconductor substrate 201, respectively, by an ion doping method, an ion implantation method, or the like as appropriate.

In the case where sidewall insulating films are formed on the side surfaces of the gate electrodes 209 and 210, an impurity region having an impurity concentration different from that in the n-type impurity regions 211a and 211b and that in the p-type concentration regions 213a and 213b can be formed in regions overlapping with the sidewall insulating films.

Figure 13D:
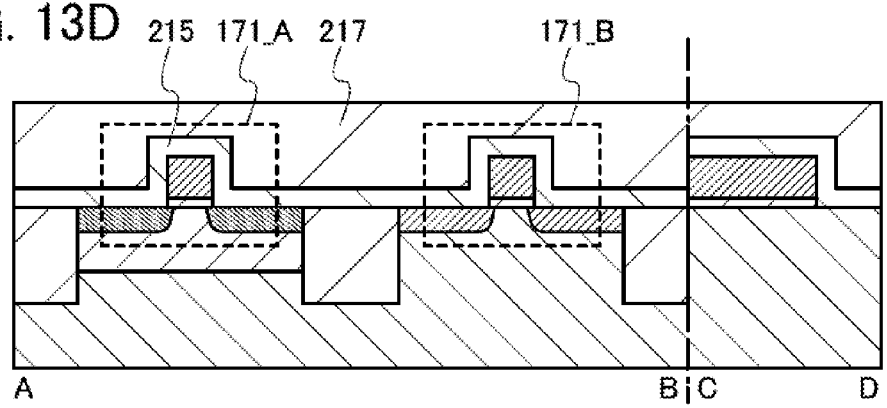

Next, as illustrated in FIG. 13D, insulating films 215 and 217 are formed by a sputtering method, a CVD method, a coating method, or the like over the semiconductor substrate 201, the element isolation region 203, the gate insulating films 207 and 208, and the gate electrodes 209 and 210.

The insulating films 215 and 217 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, a hydrogen content of the insulating film 215 can be increased. Thus, by heat treatment, the semiconductor substrate is hydrogenated and dangling bonds are terminated by hydrogen, so that defects in the semiconductor substrate can be reduced.

Note that planarity of the insulating film 217 can be increased when the insulating film 217 is formed using an inorganic material such as borophosphosilicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions 213a and 213b.

Through the above steps, the n-channel transistor 171_A and the p-channel transistor 171_B illustrated in FIG. 8C can be manufactured.

Next, part of each of the insulating films 215 and 217 is selectively etched to form opening portions. Then, contact plugs 219a to 219d are formed in the opening portions. Typically, the contact plugs 219a to 219d are formed in such a manner that after a conductive film is formed by a sputtering method, a CVD method, a plating method, or the like, planarization treatment is performed by a chemical mechanical polishing (CMP) method, an etching method, or the like, and an unnecessary portion of the conductive film is removed.

The conductive film to be the contact plugs 219a to 219d is formed in such a manner that tungsten silicide is formed by a CVD method using a $WF_6$ gas and a $SiH_4$ gas to fill the opening portions.

Next, an insulating film is formed by a sputtering method, a CVD method, or the like over the insulating film 217 and the contact plugs 219a to 219d, and then, part of the insulating film is selectively etched to form insulating films 221a to 221e having groove portions. Next, after a conductive film is formed by a sputtering method, a CVD method, or the like, planarization treatment is performed by a CMP method, an etching method, or the like, and an unnecessary portion of the conductive film is removed; thus, wirings 223a to 223c are formed (see FIG. 14A).

The insulating films 221a to 221e can be formed using a material similar to that of the insulating film 215.

The wirings 223a to 223c are formed to have a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

Note that the contact plugs 219a to 219d and the wirings 223a to 223c may be formed by a dual damascene method.

The insulating films 221a to 221e and the wirings 223a to 223c which are planarized are used, whereby variation in electric characteristics of a transistor whose channel formation region is formed in an oxide semiconductor film to be formed later can be reduced. Further, the transistor whose channel formation region is formed in an oxide semiconductor film can be manufactured with a high yield.

Next, heat treatment or plasma treatment is preferably performed so that hydrogen, water, or the like contained in the insulating films 221a to 221e and the wirings 223a to 223c is released. Consequently, in heat treatment performed later, diffusion of hydrogen, water, or the like to an insulating film and an oxide semiconductor film to be formed later can be prevented.

Next, an insulating film 225 is formed by a sputtering method, a CVD method, or the like over the insulating films 221a to 221e and the wirings 223a to 223c. The insulating film 225 is formed with a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. As the oxide insulating film from which part of oxygen is released by heating, an oxide insulating film containing oxygen at a proportion exceeding the stoichiometric proportion is used. Oxygen is released by heating from the oxide insulating film; therefore, oxygen can be diffused into the oxide semiconductor film by heating.

In the case where the insulating film 225 is formed by a CVD method, hydrogen or water derived from a source gas is sometimes mixed in the insulating film 225. Therefore, heat treatment is preferably performed as dehydrogenation or dehydration after the insulating film 225 is formed by a CVD method. The heat treatment is preferably performed at a temperature at which hydrogen or water is released from the insulating film 225.

An electric furnace, a rapid thermal annealing (RTA) apparatus, or the like can be used for the heat treatment. With the use of an RTA apparatus, the heat treatment can be performed at a temperature of higher than or equal to the strain point of the substrate if the heating time is short. Thus, time during which hydrogen or water is released from the oxide insulating film can be shortened.

By the heat treatment, dehydrogenation or dehydration can be performed on the insulating film 225 and thus, diffusion of hydrogen or water to an oxide semiconductor film to be formed later can be suppressed.

The heat treatment for dehydration or dehydrogenation may be performed plural times, and may also serve as another heat treatment.

In the case of adding oxygen to the insulating film 225 formed by a CVD method, the amount of oxygen released by heating can be increased. Oxygen can be added to the insulating film 225 by an ion implantation method, an ion doping method, plasma treatment, or the like.

Figure 14A:
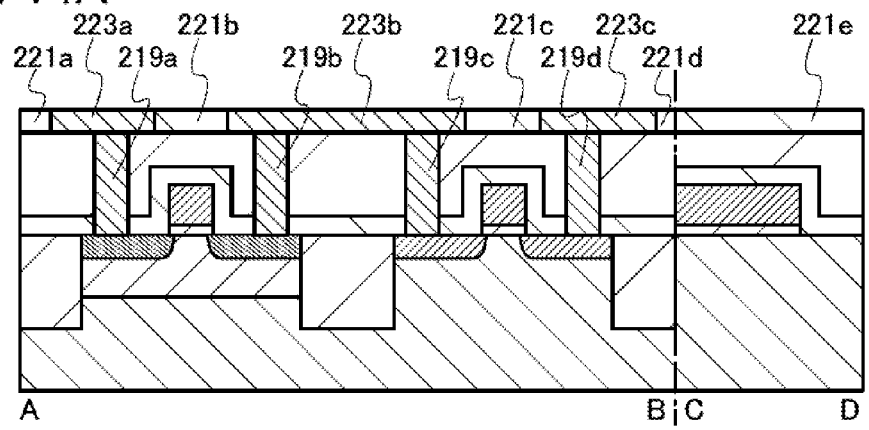
FIGS. 14A to 14C illustrate steps of manufacturing a programmable logic device.
Figure 14B:
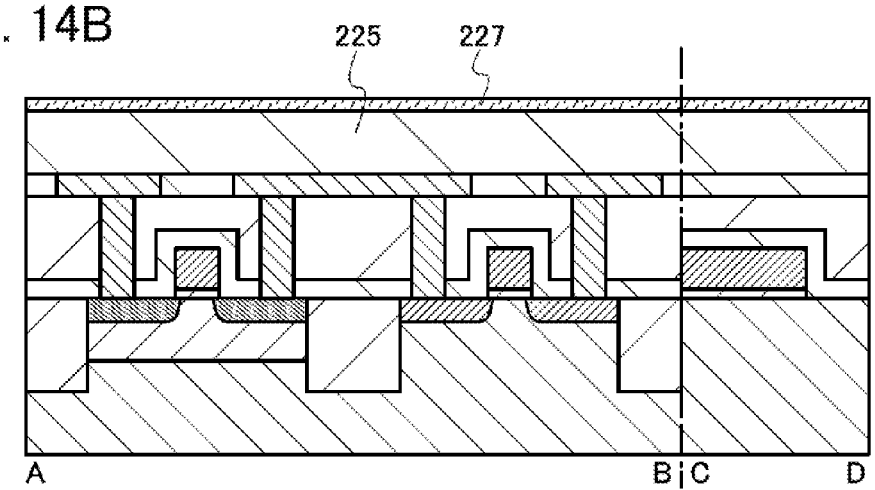

Next, an oxide semiconductor film 227 is formed over the insulating film 225 by a sputtering method, a coating method, a printing method, a pulsed laser deposition method, or the like (see FIG. 14B). Here, as the oxide semiconductor film 227, an oxide semiconductor film having a thickness of greater than or equal to 1 nm and less than or equal to 50 nm, preferably greater than or equal to 3 nm and less than or equal to 30 nm is formed by a sputtering method.

For example, in the case where the oxide semiconductor film 227 is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the amount of hydrogen, water, or the like entering the oxide semiconductor film can be reduced and the oxide semiconductor film can be a CAAC-OS film.

A sputtering apparatus used for forming the oxide semiconductor film 227 will be described in detail below.

The leakage rate of a treatment chamber in which the oxide semiconductor film 227 is formed is preferably lower than or equal to $1 \times 10^{-10}$ Pa·m$^3$/sec., whereby entry of an impurity into the film to be formed by a sputtering method can be decreased.

Evacuation of the treatment chamber in the sputtering apparatus is preferably performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen and water. Further, a combination with a sputter ion pump having a high capability in evacuating hydrogen or a cryopump having a high capability in evacuating water is effective.

An adsorbate present at the inner wall of the treatment chamber does not affect the pressure in the treatment chamber because it is adsorbed on the inner wall, but the adsorbate leads to release of a gas at the time of the evacuation of the treatment chamber. Therefore, although the leakage rate and the evacuation rate do not have a correlation, it is important that the adsorbate present in the treatment chamber be desorbed as much as possible and evacuation be performed in advance with the use of a pump having high evacuation capability. Note that the treatment chamber may be subjected to baking for promotion of desorption of the adsorbate.

As described above, in the process for forming the oxide semiconductor film 227 and preferably in the process for forming the insulating film 225, entry of impurities is suppressed as much as possible through control of the pressure of the treatment chamber, leakage rate of the treatment chamber, and the like, whereby entry of impurities including hydrogen into the oxide semiconductor film 227 can be reduced. In addition, diffusion of impurities such as hydrogen and water from the insulating film 225 to the oxide semiconductor film 227 can be reduced.

Hydrogen contained in the oxide semiconductor film is reacted with oxygen bonded to a metal atom to be water, and in addition, a vacancy is formed in a lattice from which oxygen is removed (or a portion from which oxygen is removed). Thus, the impurities containing hydrogen are reduced as much as possible in the process for forming the oxide semiconductor film, whereby vacancies in the oxide semiconductor film can be reduced. Therefore, when a channel region is formed in an oxide semiconductor film which is purified by removing impurities as much as possible, the transistor can have higher reliability.

In a sputtering method, an RF power supply device, an AC power supply device, a DC power supply device, or the like can be used as a power supply device for generating plasma as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas. It is preferable that a high-purity gas from which impurities containing hydrogen are removed be used as a sputtering gas.

Note that before the oxide semiconductor film 227 is formed by a sputtering apparatus, a dummy substrate may be put into the sputtering apparatus, and an oxide semiconductor film may be formed over the dummy substrate, so that hydrogen, water, and the like attached to the target surface or a deposition shield may be removed.

By forming the insulating film 225 and the oxide semiconductor film 227 successively without exposure to the air, impurities such as hydrogen and water in the air can be prevented from entering the interface between the insulating film 225 and the oxide semiconductor film 227, which is preferable. For example, the insulating film 225 is formed in a first treatment chamber of a multi-chamber sputtering apparatus. Next, the semiconductor substrate 201 over which the insulating film 225 is formed is heated in a preheating chamber, and impurities such as hydrogen and water contained in the semiconductor substrate 201 and the insulating film 225 are released. Note that the heating temperature at this time is preferably in a temperature range in which oxygen is not released from the insulating film 225. Next, the oxide semiconductor film 227 is formed in a second treatment chamber, so that the insulating film 225 and the oxide semiconductor film 227 can be formed successively without exposure to the air.

Any of the oxide semiconductors described in Embodiment 1 is used for the oxide semiconductor film 227 as appropriate.

In an oxide semiconductor having crystallinity, defects in the bulk can be further reduced and when the surface flatness of the oxide semiconductor is improved, field-effect mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that Ra is obtained by expanding arithmetic mean surface roughness, which is defined by JIS B0601: 2001 (ISO4287: 1997), into three dimensions so as to be applicable to a curved surface. In addition, Ra can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

As a method for planarizing the surface of the insulating film 225, CMP treatment, an etching method, plasma treatment, or the like can be used. Note that plasma treatment is so-called reverse sputtering in which minute unevenness of the surface is reduced by introducing an inert gas such as an argon gas into a vacuum chamber and applying an electric field so that a surface to be processed serves as a cathode.

Here, as the oxide semiconductor film 227, an oxide semiconductor film having an amorphous structure is formed by a sputtering method.

Next, heat treatment is preferably performed. By the heat treatment, dehydrogenation or dehydration of the oxide semiconductor film 227 can be performed.

Figure 14C:
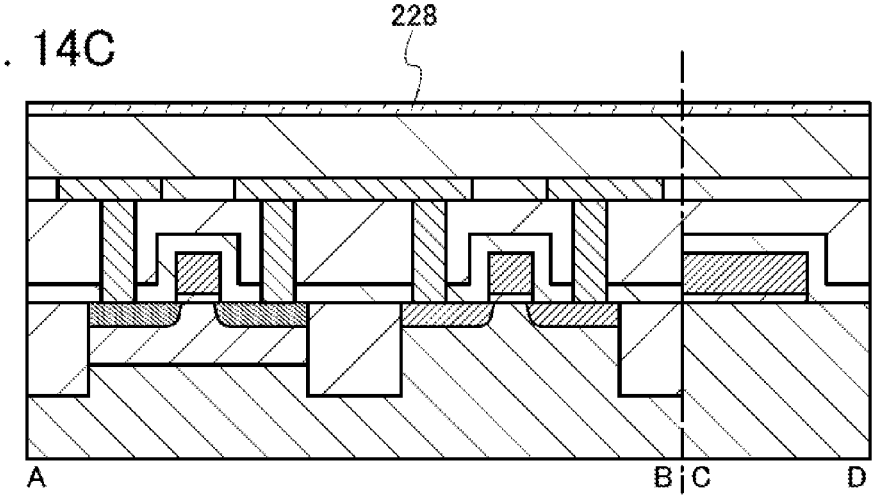

In addition, part of oxygen contained in the insulating film 225 can be diffused into the vicinity of the interface between the insulating film 225 and the oxide semiconductor film 227 by the heat treatment. As a result, the interface state of the vicinity of the interface between the insulating film 225 and the oxide semiconductor film 227 can be reduced. An oxide semiconductor film 228 subjected to the heat treatment is shown in FIG. 14C.

An electric furnace, an RTA apparatus, or the like can be used for the heat treatment. With the use of an RTA apparatus, the heat treatment can be performed at a temperature of higher than or equal to the strain point of the substrate if the heating time is short. Thus, the time during which hydrogen or water is released from the oxide semiconductor film and the time during which oxygen is diffused from the insulating film 225 into the oxide semiconductor film 227 can be shortened.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

Here, the heat treatment for dehydrogenation or dehydration is performed after the oxide semiconductor film 227 is formed over the insulating film 225; accordingly, the insulating film 225 is entirely covered with the oxide semiconductor film 227 in the heat treatment for dehydrogenation or dehydration and thus oxygen contained in the insulating film 225 can be efficiently diffused into the oxide semiconductor film 227.

The heat treatment for dehydrogenation or dehydration may be performed after an oxide semiconductor film 229 to be formed later is formed. As a result, the number of the heat treatment steps can be reduced and water or hydrogen can be released from the oxide semiconductor film 229 and the insulating film 225.

The heat treatment for dehydration or dehydrogenation may be performed plural times, and may also serve as another heat treatment.

Next, part of the oxide semiconductor film 228 is selectively etched to form the oxide semiconductor film 229. Then, an insulating film 231 is formed over the oxide semiconductor film 229 by a sputtering method, a CVD method, or the like. After that, a gate electrode 233 is formed over the insulating film 231 (see FIG. 15A).

The insulating film 231 may be formed with a single layer or a stack using one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may also be an oxide insulating film from which oxygen is released by heating, such as the insulating film 225. By using a film from which oxygen is released by heating as the insulating film 231, oxygen vacancies caused in the oxide semiconductor film 229 can be reduced by heat treatment performed later and deterioration of electric characteristics of the transistor can be suppressed.

When the insulating film 231 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be decreased even when the thickness of the gate insulating film is reduced.

The thickness of the insulating film 231 is preferably greater than or equal to 10 nm and less than or equal to 300 nm, more preferably greater than or equal to 5 nm and less than or equal to 50 nm, still more preferably greater than or equal to 10 nm and less than or equal to 30 nm.

The insulating film 231 can be formed by a sputtering method, a CVD method, or the like. Further, a silicon oxynitride film formed by a microwave plasma CVD method using silane and dinitrogen monoxide as source gases is dense; therefore, when such a silicon oxynitride film is used as the insulating film 231, generation of gate leakage current of a transistor to be completed later can be prevented even when the insulating film 231 is thin.

The gate electrode 233 can be formed using the material of the gate electrodes 209 and 210 as appropriate. Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

As a material layer in contact with the insulating film 231, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like is preferably provided between the gate electrode 233 and the insulating film 231. These films each have a work function of higher than or equal to 5 eV, preferably higher than or equal to 5.5 eV, which is higher than the electron affinity of the oxide semiconductor; thus, the threshold voltage of the transistor including the oxide semiconductor can be positive. Accordingly, a so-called normally-off switching element can be obtained. For example, in the case of using an In—Ga—Zn-based oxynitride semiconductor film, an In—Ga—Zn-based oxynitride semiconductor film having a higher nitrogen concentration than at least the oxide semiconductor film 229, specifically, an In—Ga—Zn-based oxynitride semiconductor film having a nitrogen concentration of higher than or equal to 7 at. % is used.

Heat treatment is preferably performed after that. Through this heat treatment, oxygen can be diffused from the insulating film 225 or the insulating film 231 to the oxide semiconductor film 229 to repair the oxygen defects included in the oxide semiconductor film 229; thus, the oxygen defects can be reduced.

Figure 15A:
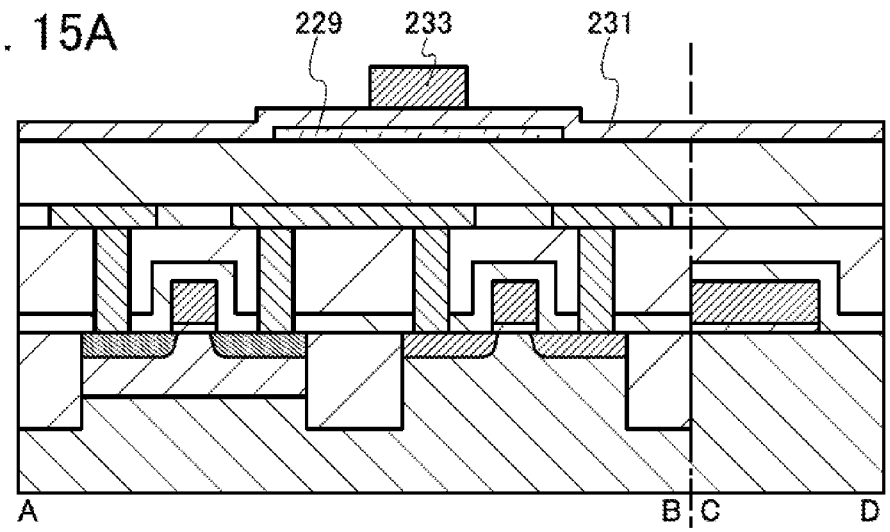
FIGS. 15A to 15C illustrate steps of manufacturing a programmable logic device.
Figure 15B:
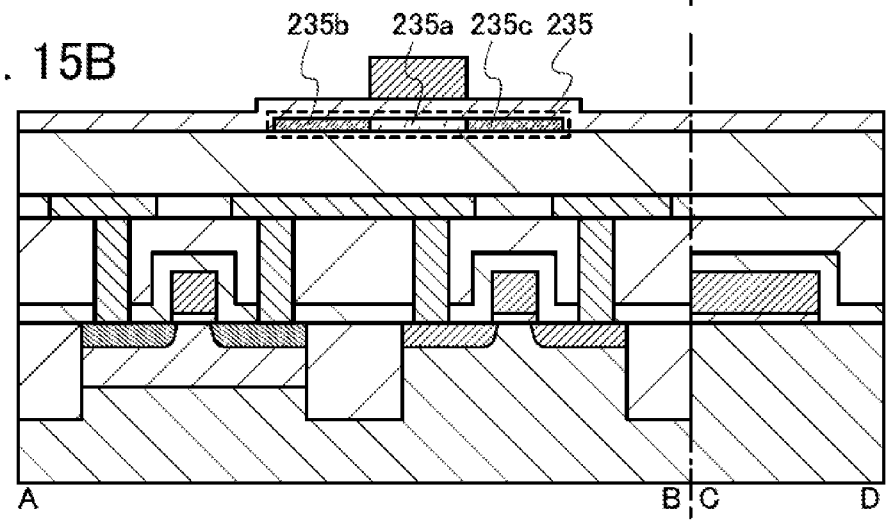

Next, treatment for adding dopant to the oxide semiconductor film 229 is performed with the use of the gate electrode 233 as a mask. As a result, as illustrated in FIG. 15B, a first region 235a which is covered with the gate electrode 233 and to which the dopant is not added and a pair of second regions 235b and 235c containing the dopant are formed. Since the dopant is added with the use of the gate electrode 233 as a mask, the first region 235a to which the dopant is not added and the pair of second regions 235b and 235c containing the dopant can be formed in a self-aligned manner. The first region 235a which overlaps with the gate electrode 233 serves as a channel region. The first region 235a and the pair of second regions 235b and 235c containing the dopant constitute an oxide semiconductor film 235.

The concentration of hydrogen in the first region 235a of the oxide semiconductor film 235 is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, still more preferably lower than or equal to $1 \times 10^{16}$ atoms/cm$^3$. By a bond of an oxide semiconductor and hydrogen, part of hydrogen serves as a donor to generate electrons as carriers. For that reason, by reduction in the concentration of hydrogen in the first region 235a of the oxide semiconductor film 235, a negative shift of the threshold voltage can be reduced.

The concentration of the dopant in the pair of second regions 235b and 235c is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{19}$ atoms/cm$^3$.

Since the pair of second regions 235b and 235c contains the dopant, the carrier density or the number of defects can be increased. Therefore, the conductivity can be higher than that of the first region 235a which does not contain the dopant. Note that an excessive increase in the concentration of the dopant causes inhibition of carrier movement by the dopant, which leads to a reduction in conductivity of the pair of second regions 235b and 235c containing the dopant.

The pair of second regions 235b and 235c containing the dopant preferably has a conductivity of higher than or equal to 0.1 S/cm and lower than or equal to 1000 S/cm, preferably higher than or equal to 10 S/cm and lower than or equal to 1000 S/cm.

The oxide semiconductor film 235 includes the pair of second regions 235b and 235c containing the dopant, whereby source-drain breakdown voltage can be increased.

As a method for adding the dopant to the oxide semiconductor film 229, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Further alternatively, hydrogen may be added as the dopant. Still alternatively, as the dopant, at least one of boron, nitrogen, phosphorus, and arsenic, at least one of helium, neon, argon, krypton, and xenon, and hydrogen in appropriate combination can be added.

The addition of the dopant to the oxide semiconductor film 229 is conducted in a state where the oxide semiconductor film 229 is covered with the insulating film and the like; alternatively, the addition of the dopant may be conducted in a state where the oxide semiconductor film 229 is exposed.

Further, the dopant can be added by a method other than an ion doping method, an ion implantation method, or the like. For example, the dopant can be added in the following manner: plasma is generated in an atmosphere of a gas containing an element to be added and plasma treatment is performed on an object to which the dopant is added. A dry etching apparatus, a CVD apparatus, or the like can be used to generate the plasma.

After that, heat treatment may be performed. Through the heat treatment, the resistance of the pair of second regions 235b and 235c containing the dopant can be reduced. In the heat treatment, the pair of second regions 235b and 235c containing the dopant may be in either a crystalline state or an amorphous state.

Figure 15C:
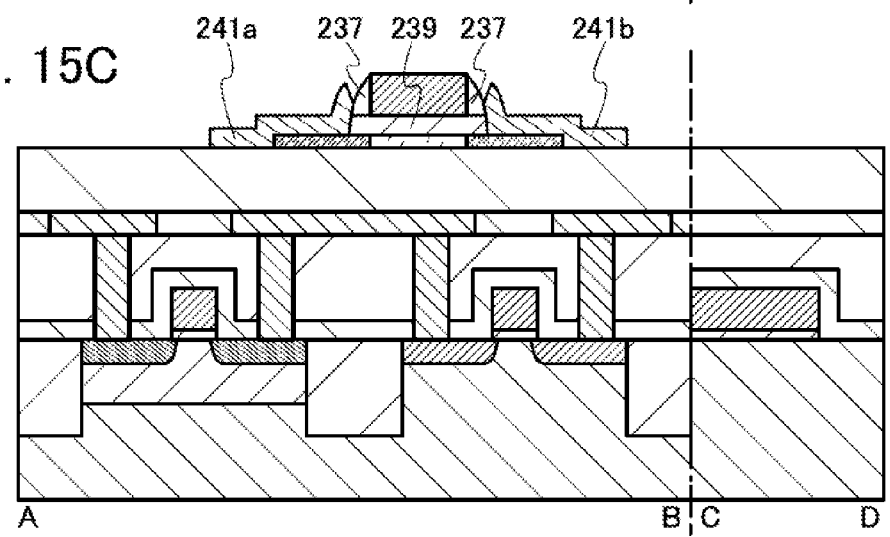

Next, as illustrated in FIG. 15C, sidewall insulating films 237 on side surfaces of the gate electrode 233, a gate insulating film 239, and the electrodes 241a and 241b are formed.

The sidewall insulating films 237 may each be formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. Like the insulating film 225, the sidewall insulating films 237 may be formed using an oxide insulating film from which part of oxygen is released by heating.

A method for forming the sidewall insulating films 237 is described below.

First, an insulating film to be the sidewall insulating films 237 is formed over the insulating film 231 and the gate electrode 233. The insulating film is formed by a sputtering method, a CVD method, or the like. In addition, although the thickness of the insulating film is not particularly limited, the thickness is selected as appropriate in consideration of coverage with respect to the shape of the gate electrode 233.

Then, the sidewall insulating films 237 are formed by etching the insulating film. The etching here is highly anisotropic etching, and the sidewall insulating films 237 can be formed in a self-aligned manner by performing the highly anisotropic etching on the insulating film.

When the sidewall insulating films 237 are formed, the insulating film 231 is also etched by the highly anisotropic etching and the oxide semiconductor film 235 is exposed, whereby the gate insulating film 239 is formed.

The pair of electrodes 241a and 241b can be formed using a material similar to that of the wirings 223a to 223c, as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by a sputtering method, a CVD method, an evaporation method, or the like and then part of the conductive film is selectively etched.

The pair of electrodes 241a and 241b is preferably formed to be in contact with side surfaces of the sidewall insulating films 237 and the gate insulating film 239. In other words, it is preferable that end portions of the pair of electrodes 241a and 241b of the transistor be located on the sidewall insulating films 237 and that the pair of electrodes 241a and 241b entirely cover exposed portions of the pair of second regions 235b and 235c containing the dopant in the oxide semiconductor film 235. As a result, regions in the pair of second regions 235b and 235c containing the dopant, which are in contact with the pair of electrodes 241a and 241b, serve as a source region and a drain region. In addition, regions of the pair of second regions 235b and 235c including the dopant, which overlap with the sidewall insulating films 237 or the gate insulating film 239, can improve source-drain breakdown voltage. Further, the distance between a source and a drain can be controlled by the width of the sidewall insulating films 237; thus, end portions of the pair of electrodes 241a and 241b, which are on the channel side and in contact with the oxide semiconductor film 235, can be formed without a mask. Further, because a mask is not used, variation of a plurality of transistors due to processing can be reduced.

Note that the sidewall insulating films 237 are provided in contact with the side surfaces of the gate electrode 233 in this embodiment; however, the present invention is not limited to this structure, and the sidewall insulating films 237 are not necessarily provided. Although the sidewall insulating films 237 are formed after the pair of second regions 235b and 235c is formed in this embodiment, the present invention is not limited to this structure and the pair of second regions 235b and 235c may be formed after the sidewall insulating films 237 are formed.

Through the above steps, a transistor including an oxide semiconductor film can be manufactured as the transistor 121a.

Figure 16A:
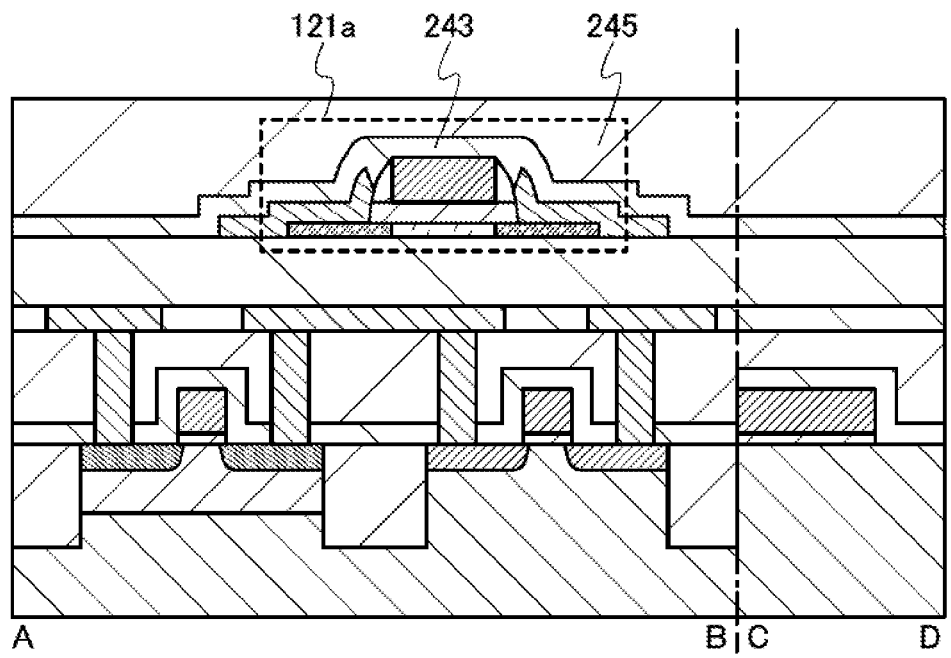
FIGS. 16A and 16B illustrate steps of manufacturing a programmable logic device.
Figure 16B:
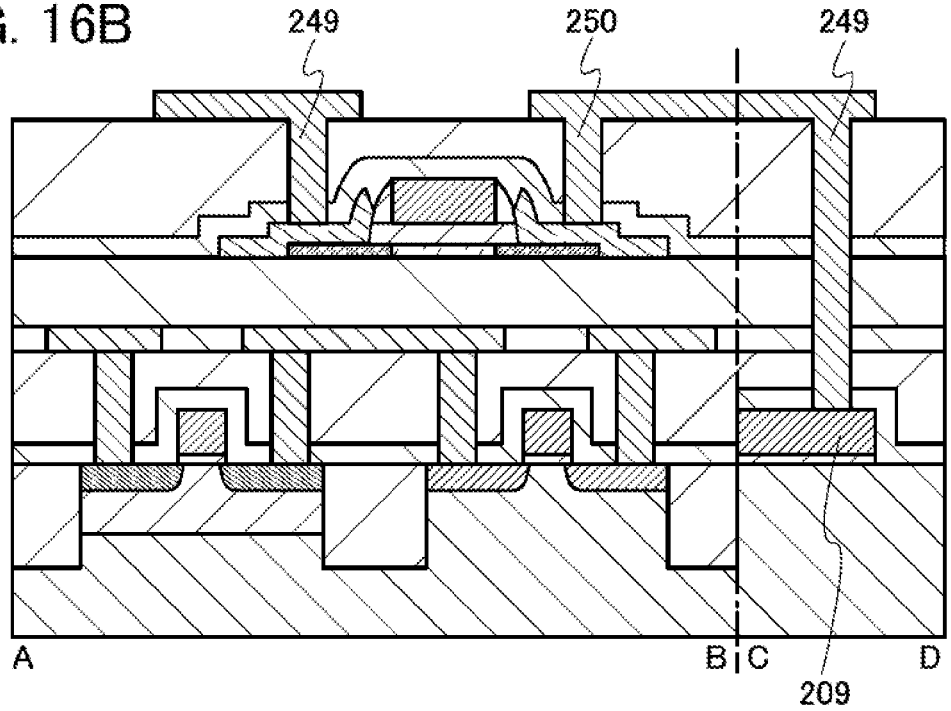

Next, as illustrated in FIG. 16A, an insulating film 243 and an insulating film 245 are formed by a sputtering method, a CVD method, a coating method, a printing method, or the like.

The insulating films 243 and 245 may each be formed with a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 245 is formed using an insulating film which prevents diffusion of oxygen to the outside, oxygen released from the insulating film 243 can be supplied to the oxide semiconductor film. Typical examples of the insulating film which prevents diffusion of oxygen to the outside include films of aluminum oxide, aluminum oxynitride, and the like. When an insulating film which prevents diffusion of hydrogen from the outside is used as the insulating film 245, diffusion of hydrogen from the outside to the oxide semiconductor film can be reduced, and defects in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, such as the one used as the insulating film 225, an insulating film which prevents diffusion of oxygen to the outside, and an oxide insulating film, oxygen can be efficiently diffused into the oxide semiconductor film and oxygen can be prevented from being released to the outside; accordingly, variation in transistor characteristics can be reduced even at high temperature and in high humidity.

Through the above steps, the transistor 121a whose channel formation region is formed in an oxide semiconductor film can be formed. Note that the transistor 121a includes the oxide semiconductor film 235 which is i-type (intrinsic) or substantially i-type, and therefore exhibits excellent characteristics.

Although the transistor 121a of this embodiment has a top-gate structure, the present invention is not limited to the top-gate structure and a bottom-gate structure may be employed, for example.

Next, part of each of the insulating films 215, 217, 221e, 225, 243, and 245 is selectively etched, so that opening portions are formed to expose part of each of the gate electrode 209, the electrode 241a, and the electrode 241b. After a conductive film is formed in the opening portions, part of the conductive film is selectively etched; thus, a wiring 249 in contact with the electrode 241a and the gate electrode 209, and a wiring 250 in contact with the electrode 241b are formed. The wirings 249 and 250 can be formed using a material used for the contact plugs 219a to 219d as appropriate.

Through the above steps, the n-channel transistor 171_A, the p-channel transistor 171_B, and the transistor 121a can be manufactured.

In a memory element included in a memory device, a transistor whose channel region is formed in an oxide semiconductor film can be stacked over a transistor which includes a semiconductor substrate or a semiconductor film provided over an insulating substrate. Consequently, a programmable logic device can be highly integrated.

This embodiment can be implemented in appropriate combination with the above embodiment.

This application is based on Japanese Patent Application serial no. 2012-045802 filed with Japan Patent Office on Mar. 1, 2012, the entire contents of which are hereby incorporated by reference.

What is claimed is:

1. A programmable logic device comprising:
an arithmetic circuit portion comprising a first arithmetic circuit and a second arithmetic circuit, the first arithmetic circuit comprising:
 a first switch arithmetic circuit including a first switch transistor between logic circuits and determining a logic state of the first arithmetic circuit in accordance with configuration data; and
 a first memory circuit including a first transistor comprising an oxide semiconductor in a channel formation region, and
the second arithmetic circuit comprising:
 a second switch arithmetic circuit including a second switch transistor between logic circuits and determining a logic state of the second arithmetic circuit in accordance with the configuration data; and
 a second memory circuit including a second transistor;
a configuration changing circuit for changing the logic state of the first arithmetic circuit and the logic state of the second arithmetic circuit by rewriting the configuration data;
a power supply control circuit for switching between start and stop of supply of power supply voltage to the first arithmetic circuit and the second arithmetic circuit;
a state memory circuit for storing data on the logic state of the first arithmetic circuit and data on the logic state of the second arithmetic circuit; and
an arithmetic state control circuit for controlling the configuration changing circuit and the power supply control circuit in accordance with the data stored in the state memory circuit.

2. The programmable logic device according to claim 1, wherein a channel formation region of the second transistor comprises a semiconductor material in a semiconductor substrate or an SOI substrate.

3. The programmable logic device according to claim 1, wherein the first transistor is connected to a gate of the first switch transistor, and
wherein the configuration data is stored in the gate of the first switch transistor when supply of power supply voltage from the power supply control circuit is stopped.

4. The programmable logic device according to claim 1, wherein the oxide semiconductor includes indium, gallium and zinc.

5. A programmable logic device comprising:
an arithmetic circuit portion comprising a first arithmetic circuit and a second arithmetic circuit, the first arithmetic circuit comprising:
 a first switch arithmetic circuit including a first switch transistor between logic circuits and determining a logic state of the first arithmetic circuit in accordance with configuration data; and
 a first memory circuit including a first transistor comprising an oxide semiconductor in a channel formation region; and
the second arithmetic circuit comprising:
 a second switch arithmetic circuit including a second switch transistor between logic circuits and determining a logic state of the second arithmetic circuit in accordance with the configuration data; and
 a second memory circuit including a second transistor;
a configuration changing circuit for changing the logic state of the first arithmetic circuit and the logic state of the second arithmetic circuit by rewriting the configuration data;
a power supply control circuit for switching between start and stop of supply of power supply voltage to the first arithmetic circuit and the second arithmetic circuit;
a state memory circuit for storing data on a configuration state, data on a use status, data on use frequency, and data on last use of the first arithmetic circuit and the second arithmetic circuit; and
an arithmetic state control circuit for controlling the configuration changing circuit and the power supply control circuit in accordance with the data on the configuration state, the data on the use status, the data on the use frequency and the data on the last use.

6. The programmable logic device according to claim 5, wherein a channel formation region of the second transistor comprises a semiconductor material in a semiconductor substrate or an SOI substrate.

7. The programmable logic device according to claim 5, wherein the first transistor is connected to a gate of the first switch transistor, and
wherein the configuration data is stored in the gate of the first switch transistor when supply of power supply voltage from the power supply control circuit is stopped.

8. The programmable logic device according to claim 5, wherein the oxide semiconductor includes indium, gallium and zinc.

9. The programmable logic device according to claim 5, wherein the arithmetic state control circuit determines the use frequency of the first arithmetic circuit and the second arithmetic circuit in accordance with the data on the use frequency and selects the first memory circuit or the second memory circuit in accordance with a determination result.

10. The programmable logic device according to claim 5, wherein the configuration data is stored in the first memory circuit in the case where the use frequency is high or middle.

11. The programmable logic device according to claim 5, wherein the configuration data is stored in the second memory circuit in the case where the use frequency is low.

12. The programmable logic device according to claim 5, wherein the logic state of the first arithmetic circuit and the logic state of the second arithmetic circuit are searched for on the basis of the data on the configuration state, and wherein the configuration changing circuit rewrites the configuration data in accordance with a search result.

13. The programmable logic device according to claim 5, wherein the configuration changing circuit rewrites the configuration data on the basis of the data on the use frequency and the data on the last use.

14. The programmable logic device according to claim 5, wherein the power supply control circuit controls supply of power supply voltage to the arithmetic circuit portion on the basis of the data on the use frequency.

15. The programmable logic device according to claim 5, wherein the data on the last use is updated on the basis of data of a timer circuit included in the arithmetic state control circuit.

* * * * *

UNITED STATES PATENT AND TRADEMARK OFFICE
CERTIFICATE OF CORRECTION

PATENT NO. : 8,975,917 B2  
APPLICATION NO. : 13/778210  
DATED : March 10, 2015  
INVENTOR(S) : Seiichi Yoneda Page 1 of 1

It is certified that error appears in the above-identified patent and that said Letters Patent is hereby corrected as shown below:

Specification

Column 5, Line 16, replace "T_1" with --T_l--;

Column 5, Line 19, replace "T_1" with --T_l--;

Column 5, Line 23, replace "T_1" with --T_l--;

Column 8, Line 39, replace "$InMO_3(ZnO)_n$" with --$InMO_3(ZnO)_m$--;

Column 13, Line 29, replace "N1" with --IN--;

Column 13, Line 33, replace "1222" with --122_2--;

Column 13, Line 35, replace "1224" with --122_4--;

Column 13, Line 40, replace "CM" with --Cin--;

Column 13, Line 41, replace "1224" with --122_4--;

Column 16, Line 31, replace "T_1" with --T_l--;

Column 17, Line 14, replace "T_1" with --T_l--;

Column 17, Line 15, replace "T_1" with --T_l--; and

Column 24, Line 30, replace "$1 \times 10^{-1o}$" with --$1 \times 10^{-10}$--.

Signed and Sealed this  
Tenth Day of November, 2015

Michelle K. Lee  
*Director of the United States Patent and Trademark Office*